(12) United States Patent  
Floyd et al.

(10) Patent No.: US 9,858,245 B2  
(45) Date of Patent: Jan. 2, 2018

(54) PANOPTIC VISUALIZATION OF ELEMENTS OF A COMPLEX SYSTEM USING A MODEL VIEWER

(71) Applicant: The Boeing Company, Seal Beach, CA (US)

(72) Inventors: Joseph F Floyd, University Place, WA (US); Stephen P Miller, Bellevue, WA (US); Brent L Hadley, Kent, WA (US); Patrick J Eames, Newcastle, WA (US); Kyle M Hadley, Kent, WA (US)

(73) Assignee: THE BOEING COMPANY, Chicago, IL (US)

( * ) Notice: Subject to any disclaimer, the term of this patent is extended or adjusted under 35 U.S.C. 154(b) by 884 days.

(21) Appl. No.: 13/751,937

(22) Filed: Jan. 28, 2013

(65) Prior Publication Data

US 2014/0215317 A1 Jul. 31, 2014

(51) Int. Cl.
*G06F 17/21* (2006.01)
*G06F 17/22* (2006.01)
(Continued)

(52) U.S. Cl.
CPC ........ *G06F 17/211* (2013.01); *G06F 3/04842* (2013.01); *G06F 17/2235* (2013.01); *G06F 17/30011* (2013.01); *G06F 17/50* (2013.01)

(58) Field of Classification Search
CPC .. G06F 3/04842; G06F 17/2235; G06F 17/50; G06F 17/221; G06F 17/30011
(Continued)

(56) References Cited

U.S. PATENT DOCUMENTS 5,341,466 A 8/1994 Perlin et al.
RE36,145 E 3/1999 DeAguiar et al.
(Continued)

FOREIGN PATENT DOCUMENTS

CN 102687150 A 9/2012
CN 102693253 A 9/2012
(Continued)

OTHER PUBLICATIONS

About Deep Zoom Composer, 4 pages retrieved on Nov. 23, 2011 http://msdn.microsoft.com/en-us/library/dd409068(d-printer).aspx.
(Continued)

*Primary Examiner* — Kavita Padmanabhan
*Assistant Examiner* — Brian Garmon
(74) *Attorney, Agent, or Firm* — Womble Bond Dickinson (US) LLP

(57) ABSTRACT

A system is provided that includes a model viewer configured to receive selection of a point on a visual presentation of a digital 3D model of a complex system, and translate the point to a location within a coordinate system of the complex system. A search engine configured to identify a document component that depicts an element of the complex system at or within a volume about the location. The document component is from a collection for which at least some components depict elements of the complex system and have associated metadata that includes information reflecting the 3D geometry of at least some depicted elements. A layout engine configured to generate a layout of panoptically-arranged document components including the identified document component and other document component(s) identified according to the associated metadata for the identified document component, which further includes information identifying a link between the respective document components.

6 Claims, 13 Drawing Sheets

(51) Int. Cl.
   *G06F 3/0484* (2013.01)
   *G06F 17/50* (2006.01)
   *G06F 17/30* (2006.01)

(58) Field of Classification Search
   USPC .................................................. 715/202, 243
   See application file for complete search history.

(56) References Cited

U.S. PATENT DOCUMENTS

| | | | |
|---|---|---|---|
| 6,611,725 | B1* | 8/2003 | Harrison et al. ............... 700/98 |
| 6,650,998 | B1 | 11/2003 | Rutledge |
| 6,684,087 | B1 | 1/2004 | Yu et al. |
| 6,704,024 | B2 | 3/2004 | Robotham et al. |
| 6,766,331 | B2 | 7/2004 | Shema et al. |
| 7,200,271 | B2 | 4/2007 | Boose et al. |
| 7,246,328 | B2 | 7/2007 | Boose et al. |
| 7,365,747 | B2 | 4/2008 | Finlayson et al. |
| 7,783,644 | B1 | 8/2010 | Petrou et al. |
| 7,802,204 | B2 | 9/2010 | Merry et al. |
| 7,870,224 | B1 | 1/2011 | Maigatter |
| 7,872,650 | B2 | 1/2011 | Fay |
| 7,921,452 | B2 | 4/2011 | Ridlon et al. |
| 8,051,031 | B2 | 11/2011 | Sims et al. |
| 2003/0055871 | A1 | 3/2003 | Roses |
| 2003/0100964 | A1 | 5/2003 | Kluge et al. |
| 2004/0003097 | A1 | 1/2004 | Willis et al. |
| 2004/0028294 | A1 | 2/2004 | Fukuda |
| 2004/0093564 | A1 | 5/2004 | Kumhyr et al. |
| 2004/0223648 | A1 | 11/2004 | Hoene et al. |
| 2004/0267701 | A1 | 12/2004 | Horvitz et al. |
| 2006/0106485 | A1* | 5/2006 | Landers et al. ............... 700/182 |
| 2006/0161863 | A1 | 7/2006 | Gallo |
| 2007/0070066 | A1* | 3/2007 | Bakhash ...................... 345/419 |
| 2007/0094615 | A1 | 4/2007 | Endo et al. |
| 2007/0226605 | A1 | 9/2007 | Thomas |
| 2008/0074423 | A1 | 3/2008 | Gan et al. |
| 2008/0111813 | A1 | 5/2008 | Gatzke et al. |
| 2008/0247636 | A1 | 10/2008 | Davis et al. |
| 2009/0086014 | A1 | 4/2009 | Lea et al. |
| 2009/0086199 | A1 | 4/2009 | Troy et al. |
| 2009/0112820 | A1 | 4/2009 | Kessel et al. |
| 2009/0138139 | A1 | 5/2009 | Tsai et al. |
| 2009/0317020 | A1 | 12/2009 | Gerhard et al. |
| 2010/0042361 | A1 | 2/2010 | Hadley et al. |
| 2010/0102980 | A1 | 4/2010 | Troy et al. |
| 2010/0223269 | A1 | 9/2010 | Shuf et al. |
| 2010/0229115 | A1 | 9/2010 | Augustine et al. |
| 2010/0306696 | A1 | 12/2010 | Groth et al. |
| 2011/0087463 | A1 | 4/2011 | Nakhle et al. |
| 2011/0087513 | A1 | 4/2011 | Floyd et al. |
| 2011/0149266 | A1 | 6/2011 | Motzer et al. |
| 2011/0235858 | A1 | 9/2011 | Hanson et al. |
| 2012/0188248 | A1 | 7/2012 | Eames et al. |
| 2012/0221625 | A1 | 8/2012 | Troy et al. |

FOREIGN PATENT DOCUMENTS

| | | |
|---|---|---|
| EP | 1 176 520 A2 | 1/2002 |
| EP | 1 503 301 A2 | 2/2005 |
| EP | 1 860 573 A1 | 11/2007 |
| EP | 2 482 538 A1 | 8/2012 |
| EP | 2 642 414 A2 | 9/2013 |
| JP | 2012-68698 A | 4/2012 |
| JP | 2012-161310 A | 8/2012 |
| WO | 2009005949 A1 | 1/2009 |

OTHER PUBLICATIONS

Airframe & Powerplant Mechanics General Handbook, US Department of Transportation Federal Aviation Administration, Chapter 2, pp. 35-52; Mar. 31, 1999.

Data differencing—Wikipedia, the free encyclopedia, 3 pages retrieved on Jul. 9, 2012 from http://en.wikipedia.org/w/index.php?title=Data_differencing&printable=yes.

"Deep Zoom" 4 pages retrieved on Apr. 18, 2012 http://en.wikipedia.org/wiki/DeepZoom.

EP Search Report dated May 15, 2012 for EP Appln. No. 12152591.9, 13 pgs.

"Futuristic software from Minority Report is real", 3 pages retrieved on Aug. 30, 2012 from http://www.foxnews.com/tech/2012/07/23/futuristic-software-from-minority-report-is-real/print.

"Hard Rock Memorabilia," 2 pages retrieved on Apr. 18, 2012 http://memorabilia.hardrock.com.

International Search Report dated Jan. 18, 2013 in PCT/US2012/058937.

International Search Report dated Dec. 21, 2012 in PCT/US2012/054808.

Li et al., "Automated Generation of Interactive 3D Exploded View Diagrams," copyright Aug. 2008, ACM Transactions on Graphics, vol. 27, No. 3, 7 pages.

Quintana et al., "Will Model-based Definition replace engineering drawings throughout the product lifecycle? A global perspective from aerospace industry," copyright 2010, Computers in Industry, vol. 61, pp. 497-508.

Tatzgern et al., "Multi-Perspective Compact Explosion Diagrams," copyright Feb. 2011, Computers & Graphics, vol. 35, No. 1, pp. 135-147.

"Theodolite Documentation/Help/FAQ" 6 pages retrieved on Dec. 14, 2012 http://hunter.pairsite.com/mobile/theodolite/help/index.html.

Written Opinion dated Jan. 18, 2013 in PCT/US2012/058937.
Written Opinion dated Dec. 21, 2012 in PCT/US2012/054808.
European Search Report dated Feb. 10, 2014 for European Application No. 13 194 943.0, 6 pages.
European Search Report dated Apr. 4, 2014 for European Application No. 14 152 644.2, 8 pages.
European Search Report dated Apr. 4, 2014 for European Application No. 14 152 646.7, 9 pages.
Cohn, "Back to Flat—Producing 2D Output from 3D Models," Autodesk University 2009, Dec. 11, 2009, pp. 1-14.
Li et al., "Automated Generation of Interactive 3D Exploded View Diagrams," ACM Transactions on Graphics, vol. 27, No. 3, Aug. 1, 2008, 7 pages.
Petre et al., "3D Model-based Semantic Labeling of 2D Objects," 2011 International Conference on Digital Image Computing: Techniques and Applications (DICTA), IEEE, Dec. 6, 2011, pp. 152-157.
Tatzgern et al., "Multi-perspective Compact Explosion Diagrams," Computers & Graphics, vol. 35, No. 1, Feb. 1, 2011, pp. 135-147.
European Search Report dated Aug. 7, 2013 for European Application No. 13 160 361.5; 6 pages.
European Search Report dated Sep. 2, 2013 for European Application No. 13 160 848.1; 6 pages.
Rao et al., "Rich Interaction in the Digital Library," Apr. 1995, Communications of the ACM, Association for Computing Machinery, Inc., United States, vol. 38, No. 4, pp. 29-39.
European Search Report dated Dec. 12, 2013 for European Application No. 13 184 084.5, 6 pages.
European Search Report dated Mar. 6, 2013 for European Application No. 12198374.6, 7 pages.
European Search Report dated Mar. 12, 2013 for European Application No. 12198679.8, 8 pages.
European Search Report dated Mar. 19, 2013 for European Application No. 12195735.1, 7 pages.
Canadian Examination Report dated Mar. 27, 2015 for Application No. 2,834,526.
Notice of Reasons for Rejection dated Feb. 10, 2015 for Application No. 2014-012291.
Australian Patent Examination Report dated Feb. 27, 2015 for Patent Application No. 2013263764.
Australian Patent Examination Report dated Apr. 22, 2015 for Patent Application No. 2013263764.
Australian Patent Examination for Patent Application No. 2013263764 dated Aug. 17, 2015.

(56) References Cited

OTHER PUBLICATIONS

Kit M, "Understand even the First Time! 3D Animation Programming", C Magazine, Japan Softbank Publishing KK, May 2002, vol. 14, No. 5, pp. 24-43.
Decision of Rejection prepared Feb. 23, 2016 for Application No. 2014-012291.
First Chinese Office Action dated Oct. 27, 2016 for Application No. 201410041080.5.
Second Chinese Office Action dated Jun. 19, 2017 for Application No. 201410041080.5.

* cited by examiner

PANOPTIC VISUALIZATION OF ELEMENTS OF A COMPLEX SYSTEM USING A MODEL VIEWER

CROSS-REFERENCE TO RELATED APPLICATION(S)

The present application is related to U.S. patent application Ser. No. 13/414,987, entitled: Panoptic Visualization Document Layout, U.S. patent application Ser. No. 13/414,964, entitled: Panoptic Visualization Document Navigation, and U.S. patent application Ser. No. 13/414,940, entitled: Panoptic Visualization Document Collection, all of which filed on Mar. 8, 2012; and which claim priority to respective ones of U.S. Provisional Patent Application No. 61/578,349, entitled: Panoptic Visualization Document Layout, U.S. Provisional Patent Application No. 61/578,357, entitled: Panoptic Visualization Document Navigation, and U.S. Provisional Patent Application No. 61/578,361, entitled: Panoptic Visualization Document Collection, all of which filed on Dec. 21, 2011. The present application is also related to U.S. patent application Ser. No. 13/072,217, entitled: Image Management and Presentation, filed on Mar. 25, 2011, which claims priority to U.S. Provisional Patent Application No. 61/436,585, entitled: Navigation to Aircraft Maintenance Information Using Tiled 2D Illustrations, filed on Jan. 26, 2011. The contents of all of the aforementioned are incorporated herein by reference in their entireties.

TECHNOLOGICAL FIELD

The present disclosure relates generally to panoptic visualization of elements of a complex system and, in particular, to panoptic visualization of such elements using a model viewer, and possibly in a manner that reflects spatial, design or functional relationships between the elements.

BACKGROUND

Information printed about a topic is often printed on multiple pages because the information does not fit on a single page and/or is more effectively presented using multiple pages. The multiple pages may be in the same source or in multiple sources. For example, technical drawings of an aircraft may be printed such that different portions of the same diagram may be printed on different pages. Drawings of one assembly on the aircraft may be contained in one library or source, while drawings of another assembly may be contained in a second library or source.

Printed information may also be printed such that one document contains one level of detail about an object, while a second document contains a second level of detail about the same object. For example, a diagram of an aircraft may be printed such that the exterior of the aircraft is visible in the diagram. Another diagram of the same aircraft may be printed such that the exterior of the aircraft is obscured, but the interior of the aircraft is presented. Thus, a reader may use different diagrams to learn different information about the same object.

As another example, wiring diagrams of wiring systems are often printed across multiple pages because the graphical and textual information presented in the wiring diagram is too great to fit on a single page. Thus, a reader may change documents multiple times to learn information about an entire wiring system.

Documents such as engineering diagrams, technical drawings, wiring diagrams, and other suitable document types may be used in the maintenance of an aircraft. The documents are created to be viewed in printed form. However, such documents are commonly stored in electronic form and viewed on a display device of a data processing system. As a result, the reader looks through different documents that may be on different types of media. This type of review may be more time-consuming than desired to find information about an aircraft.

Documents regarding a complex system of systems such as an aircraft may therefore contain large amounts of information regarding the complex system and its components, subsystems and parts, and the connections and relationships among the respective elements of the complex system. The complexity of the system and the large amount of information often required to describe the system may increase not only the time required to study the documents, but the difficulty in comprehending the complex system and its elements. A user may not only require the time to review documents containing large amounts of information, but may also require the time and endure the difficulty of studying the information to understand the ways in which the complex system and its elements relate to each other.

Therefore, it may be desirable to have a method and apparatus that takes into account at least some of the issues discussed above, as well as possibly other issues.

BRIEF SUMMARY

Example implementations of the present invention are generally directed to a system for panoptic visualization of elements of a complex system using a model viewer, and corresponding method and computer-readable storage medium. In accordance with example implementations, pages of system-related document(s) may be panoptically arranged in a manner that reflects logical relationships between the pages, which may in turn reflect spatial, design or functional relationships between elements of the complex system. The arrangement may enable a user to see the pages in a single view, and in an arrangement that facilitates a better understanding of the relationships between the pages and elements they depict, which may be otherwise technically complex.

According to one aspect of example implementations, the system includes a model viewer configured to receive user-selection of a particular point on a visual presentation of a digital three-dimensional (3D) model of a complex system, and translate the particular point to a particular location within a coordinate system of the complex system. The system includes a search engine coupled to the model viewer and configured to identify a document component of a panoptic visualization document collection. The collection has a plurality of document components at least some of which depict elements of the complex system and have associated metadata that, for each of at least some of the depicted elements, includes information reflecting a 3D geometry of the respective element within a coordinate system of the complex system. In this regard, the identified document component depicts an element of the complex system at the particular location or within a volume about or at least in part defined by the particular location.

The system also includes a layout engine coupled to the search engine and configured to generate and communicate a layout of panoptically-arranged document components. The layout includes the identified document component and other document component(s) identified according to the associated metadata for the identified document component. The respective metadata further includes information identifying a link between the identified document component and respective one or more other document components. In one example, the link establishes a logical relationship between the identified document component and respective other document component(s) according to a spatial, design or functional relationship between element(s) of the complex system including the element depicted by the identified document component.

In one example, the associated metadata for the identified document component, and associated metadata for each of the respective other document component(s), includes information specifying a size, location and/or depth of the respective document component in the layout. In this example, for each of the document components of the layout, the layout engine may be configured to generate the layout according to the size, location and/or depth specified by the information provided in respective, associated metadata.

In various examples, at least some of the document components of the layout include two-dimensional (2D) images depicting one or more elements of the complex system, and are produced from the 3D model. In a further example, one or more document components of the layout depict element(s) of the complex system, and are not produced from the 3D model.

In one example, at least one of the document components of the layout depicts an element of the complex system and has associated metadata that includes information reflecting the 3D geometry of the respective depicted element within the coordinate system of the complex system. In this example, at least one other of the document components of the layout depicts an element of the complex system and has associated metadata absent information reflecting the 3D geometry of the respective depicted element within the coordinate system of the complex system.

In other aspects of example implementations, a method and computer-readable storage medium are provided for panoptic visualization of elements of a complex system using a model viewer. The features, functions and advantages discussed herein may be achieved independently in various example implementations or may be combined in yet other example implementations further details of which may be seen with reference to the following description and drawings.

BRIEF DESCRIPTION OF THE DRAWING(S)

Having thus described example implementations of the disclosure in general terms, reference will now be made to the accompanying drawings, which are not necessarily drawn to scale, and wherein:

Figure 7:
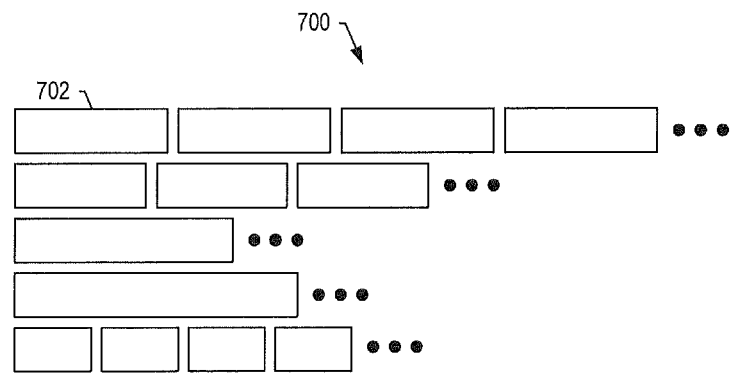
Figure 8:
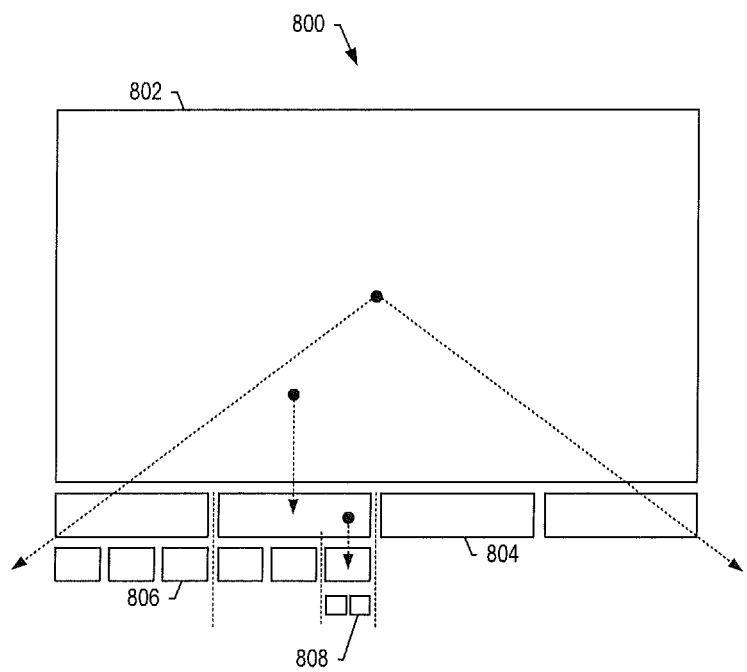
Figure 10:
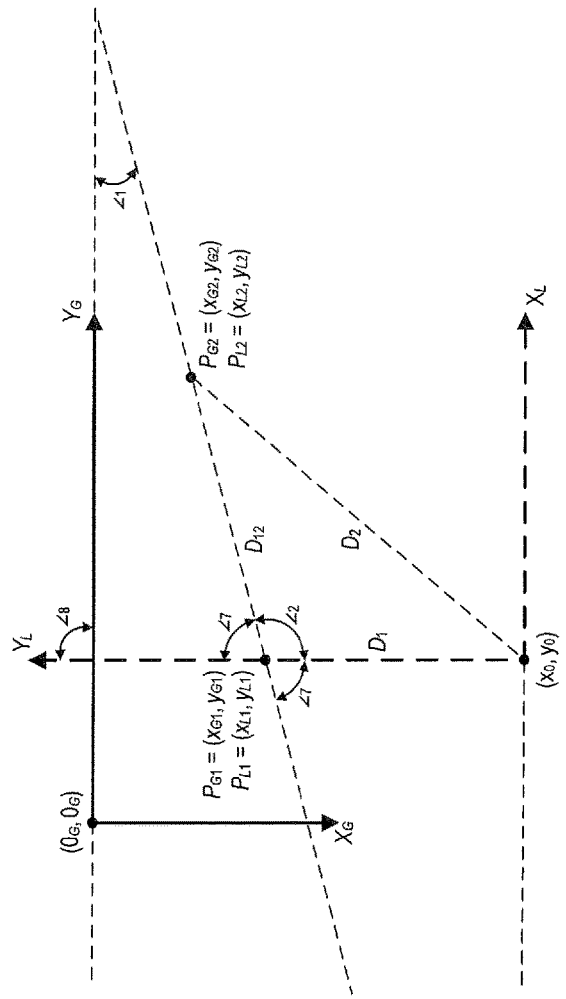
Figure 9:
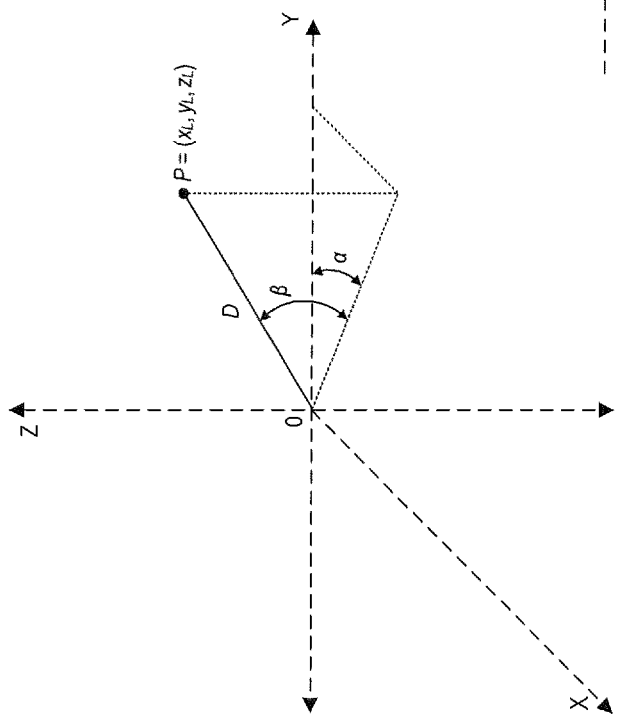

FIGS. 7 and 8 schematically illustrate examples of suitable layout models according to example implementations;

FIG. 9 illustrates a diagram of a local coordinate system, and FIG. 10 illustrates a diagram including both the local coordinate system and a global coordinate system, according to one example implementation; and FIGS. 11-15 depict example layouts of pages that may be displayed in a GUI that has a predetermined viewable area, and which may be navigated by a user, according to example implementations of the present disclosure.

DETAILED DESCRIPTION

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present invention relate generally to panoptic visualization of a three-dimensional (3D) representation of a complex system. More particularly, various example implementations relate to panoptic visualization of such a 3D representation and possibly other documents for the complex system in a manner that reflects spatial, design or functional relationships between elements of the complex system depicted by the 3D representation and other documents. Example implementations will be primarily described in conjunction with aerospace applications. It should be understood, however, that example implementations may be utilized in conjunction with a variety of other applications, both in the aerospace industry and outside of the aerospace industry. Access to accurate parts information across industries is important because it can impact multiple aspects of equipment operations, including maintenance, materials-inventory management, purchasing and procurement, engineering support, logistics planning, shipping and receiving, and warehouse facilities management.

Figure 1:
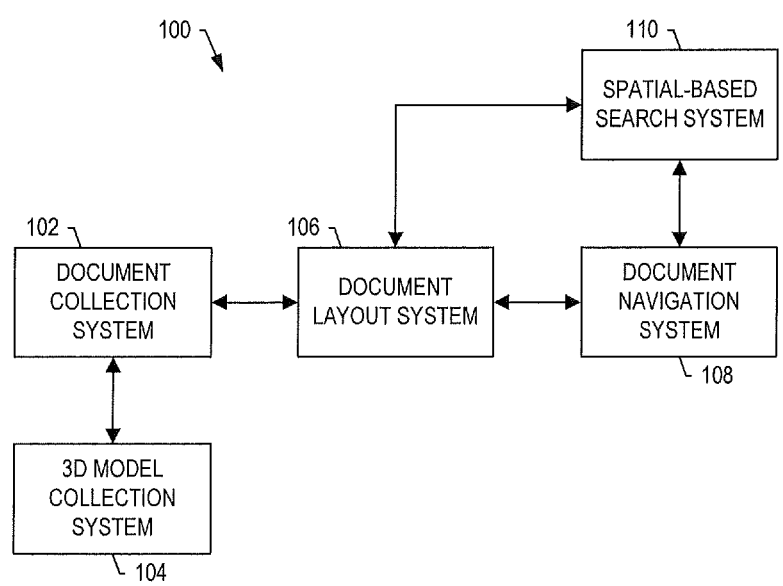
FIG. 1 is an illustration of a panoptic visualization system in accordance with an example implementation.

Referring now to FIG. 1, a panoptic visualization system 100 is illustrated according to example implementations of the present disclosure. The system may include any of a number of different subsystems (each an individual system) for performing one or more functions or operations with respect to one or more electronic documents, at least some of which may be two-dimensional (2D) derivatives of a digital three-dimensional (3D) model of a complex system. As shown, for example, the system may include a document collection system 102, 3D model collection system 104, document layout system 106, document navigation system 108 and/or spatial-based search system 110. Although being shown as part of the panoptic visualization system, one or more of the document collection system, 3D model collection system layout system, navigation system and/or spatial-based search system may instead be separate from but in communication with the panoptic visualization system. It should also be understood that one or more of the subsystems may function or operate as a separate system without regard to others of the subsystems. And further, it should be understood that the panoptic visualization system may include one or more additional or alternative subsystems than those shown in FIG. 1.

As described herein, an electronic document (or simply document) may be any electronic media content capable of being visualized in an electronic and/or printed (or printable) form. The media content of a document may include one or more of textual, graphical or other visual content such as still images, video or the like. The document may be of a number of different types of documents in which the type of document may be defined by one or more characteristics of the document such as its format, media content or the like. Examples of suitable types of documents include computer-aided design documents (e.g., CAD, CATDrawing, CATPart, CATProduct, CATProcess, cgr, DWG, DXF, DWF, etc.), text-based documents (e.g., ANS, ASC, DOC, DOCX, HTML, PDF, RTF, TXT, WPD, etc.), presentation documents (e.g., PDP, PPT, etc.), graphics documents (e.g., BMP, GIF, JPEG, JP2, PNG, PSD, PSP, RAW, TIFF, etc.), video documents (e.g., AVI, MPEG, QuickTime, WMV, etc.) or the like. Other examples of suitable types of documents include single or collections of legal documents (e.g., court decisions, briefs, patents, etc.), books, manuals, magazines or trade publications, articles, web pages, screenshots, service bulletins, engineering diagrams, warranties, technical drawings, wiring diagrams or the like. And still further examples of suitable types of documents include data sets such as engineering design data, wiring data, troubleshooting data, business data or the like.

A document may be composed of one or more constituent document components that may be groupings of its media content such as between basic breaking points. The document components may depend on the type of document and may include, for example, electronic pages, slides, diagrams, drawings, still images, videos or the like. The document component may at times be generally referred to as a "page," although the document component need not necessarily be an electronic page as it may include other types of components. In instances in which a document includes only one component, the document and its component may be one and the same.

As described herein, reference may be made to a document composed of constituent pages. It should be understood, however, that example implementations may be equally applicable to a group (collection) of documents composed of constituent documents, which may or may not be further composed of constituent pages. Thus, functions performed with respect to a document may be equally performed with respect to a group of documents, and functions performed with respect to a page may be equally performed with respect to a constituent document.

Each page may be formed of data from which a visual representation of it (or rather its media content) may be generated in an electronic and/or printed (or printable) form. The visual representation of a page may at times be generally referred to as simply the page or as an "image," although the page need not necessarily include a still image as it may include other types of media content.

A page may include media content that has one or more subjects and includes one or more objects reflecting or otherwise forming the subject(s). At times, a page may therefore be said to depict its subject(s) and/or object(s) of its subject(s). As an example, a page may have an aircraft as its subject and include an exterior or interior view or sections of the exterior/interior view of the aircraft as object(s), or the page may have the exterior/interior view as its subject and include the sections of the exterior view as objects. As another example, a page may have an aircraft instrument panel as its subject and include gauges of the instrument panel as subjects.

In various examples, one or more documents may be for a complex system such as an aircraft or any of a number of other structures including physical structures, biological structures, chemical structures or the like. As suggested above, these "system-related" documents and their system-related pages may include, for example, engineering diagrams, technical drawings, wiring diagrams or the like. These documents may also include maintenance documents and/or operations documents (either generally referred to as a "maintenance document"). A complex system may be generally composed of one or more components, subsystems or the like (each generally referred to as a "subsystem"), with each subsystem being composed of one or more parts, and each part including one or more features. In this regard, the parts of the complex system may be assembled into a number of subsystems, which in turn may be assembled into the complex system. In the context of an aircraft, one or more parts or subsystems may be designed as a modular component of the aircraft often referred to as a line-replaceable unit (LRU), of which a single aircraft may include a number of LRUs and other parts or subsystems. Any of the complex system itself or any of its subsystems, parts (of subsystems), features (of parts) or the like may at times be generally referred to as an "element" of the complex system.

Generally, a system-related document may include any of a number of documents that visually depict (e.g., graphically or textually) one or more elements of a complex system. In some examples, this depiction may include one or more maintenance or operations tasks on or using such element(s) (either generally referred to as a "maintenance task") such as for operation, installation, maintenance, repair, removal, replacement or testing of element(s) of the complex system.

Examples of suitable aircraft maintenance documents include an aircraft illustrated parts catalog (AIPC), aircraft flight manual (AFM), aircraft maintenance manual (AMM), aircraft recovery manual (ARM), airworthiness directive (AD), component maintenance manual (CMM), component maintenance manual parts list (CMMIPL), configuration change support data (CCSD), configuration deviation list (CDL), consumable products manual (CPM), engine (shop) manual (EM), engineering drawings (ED), equipment list (EL), dispatch deviation guide (DDG), engine cleaning inspection and repair manual (CIR), engine illustrated parts catalog (EIPC), engine parts configuration management section (EPCM), fault repair manual (FRM), fault reporting and fault isolation manual (FRM/FIM), flight crew operations manual (FCOM), general maintenance manual (GMM), illustrated tool and equipment manual (ITEM), in-service activity report (ISAR), maintenance planning document (MPD), maintenance review board report (MRB), maintenance synoptics, maintenance tips (MT), maintenance training manual (MTM), master minimum equipment list (MMEL), non-destructive testing manual (NDT), power plant build-up manual (PPBM), power plant build-up manual illustrated parts list (PPBMIPL), production management database (PMDB), repair record, service bulletin (SB), service bulletin index (SBI), service letter (SL), structural repair manual (SRM), systems description section (SDS), system schematics manual (SSM), tool and equipment manual (TEM), weight and balance manual (WBM), wiring diagram manual (WDM) or the like.

A system-related document may be composed of one or more pages including media content, which again may include textual, graphical (e.g., drawings) or other visual content. In one example, the media content may include drawings and/or textual lists depicting one or more elements of a complex system. In various examples, the media content may also include other information regarding the element(s).

For example, a page may include a drawing and/or textual list (media content) of a complex system (subject) including multiple subsystems (objects), a subsystem (subject) including multiple parts (objects), or a part (subject) including one or more features (objects). Additionally or alternatively, for example, a page may include a drawing and/or textual instructions (media content) of a maintenance task (subject) including multiple subtasks (objects), a subtask (subject) including multiple maintenance actions (objects), or a maintenance action (subject/object).

Drawings may graphically depict elements in various views with various levels of detail. The drawings may include detail drawings, assembly drawings and/or installation drawings. For example, a detail drawing may depict a part, and an assembly drawing may depict the complex system or one or more of its subsystems. An assembly drawing may reflect any of a number of different relationships between or among the complex system, its subsystems or parts of its subsystems. For example, an assembly drawing may reflect a relationship between subsystems of a complex system, or a relationship between parts of a subsystem. In one example, one or more assembly drawings are accompanied by one or more detailed drawings of one or more parts it depicts. An illustration drawing may depict an element in its final position on the complex system.

The drawings may depict elements in any of a number of different manners, such as by pictorial drawings, diagrams and/or orthographic projections. A pictorial drawing may depict an element as it appears to the eye (similar to a photograph). A diagram may depict the complex system or one or more of its subsystems, and may indicate their subsystems or parts and express methods or principles of manufacture, operation or the like (e.g., illustration diagram). A diagram may be of any of a number of different types, such as an engineering diagram or other technical drawing, wiring diagram, schematic diagram, installation diagram or the like.

Orthographic projection drawings may depict an element in a number of views, which may depict the element from one or more angles and/or levels of detail. For example, an element may be depicted in one or more of projection, front, top, bottom, rear, right-side and/or left-side views. Also, for example, a view of an element may be a complete view, a detail view or sectional view. A complete view may be considered a principal view of an element, and may depict the element at any angle. A detail view may only depict a portion of an element but do so in greater detail and to a larger scale than the principle view, and a sectional view may depict a portion of an element with the rest of the element being cut away at a cutting plane. In one example, the portion of an element depicted in a detail view may be encircled on a related complete view; and similarly, in one example, the portion of the element depicted in a sectional view may be indicated by the cutting plane line on the related complete view.

In addition to or in lieu of drawing(s), each of one or more pages of a system-related document may textually depict elements of the complex system. In one example, one or more pages may include one or more textual instructions (media content) for executing a maintenance task performed on or using elements of the complex system. In another example, one or more pages may include a textual list (media content) of information for the complex system and/or one or more of its elements. A list may include any of a number of different types of information regarding the complex system/elements including, for example, a name, number (e.g., system number, part number) or other identifier of the complex system/element, a required quantity of the element, the source of the complex system/element (e.g., manufacturer, distributor, etc.), the position of the element, related complex system/element identifiers or the like. The list may also include one or more references that identify the element in drawing(s) of the system-related document, and/or one or more references that identify drawing(s) depicting the element (partially or completely).

Generally, documents and/or their pages according to example implementations may have one or more logical relationships between one another. In the context of a system-related document, for example, pages sharing a common system-related document may be logically related, or pages adjacent one another in order sequence in a common system-related document may be logically related. In other examples, the pages may be logically related according to one or more relationships between elements of the complex system depicted therein. These relationships may include, for example, spatial relationships, design relationships (e.g., work breakdown structure (WBS), system function, design family), functional relationships or the like.

For example, pages depicting the same element (partially or completely) may be logically related according to the spatial, design or functional relationship of depicting the same element. A page depicting the complex system may be logically related to pages depicting the complex system's subsystems, parts or features, according to spatial, design or functional relationships between the respective elements. In another example, a page depicting a subsystem may be logically related to pages depicting the subsystem's parts or features, according to spatial, design or functional relationships between the respective elements. And in yet another example, a page depicting a part may be logically related to pages depicting the part's features, according to spatial, design or functional relationships between the respective part and features.

In another example, a page depicting an element (partially or completely) may be logically related to a page depicting a maintenance task (partially or completely) performed on or using the respective element. Likewise, a page depicting a maintenance task (partially or completely) performed on or using an element may be logically related to a page depicting the respective element (partially or completely).

In yet another example, pages depicting the same maintenance task (partially or completely) may be logically related to one another. Pages depicting subtasks of the same maintenance task may be logically related to one another. Similarly, pages depicting actions of the same subtask may be logically related to one another. A page depicting a maintenance task may be logically related to pages depicting the task's subtasks or actions. And a page depicting a subtask may be logically related to pages depicting the subtask's actions.

In one example, logical relationship(s) between pages may be reflected in the graphical (e.g., drawings) and/or textual (e.g., lists, instructions) depictions themselves. One or more drawings and/or lists depicting one or more elements may include reference(s) such as number(s), letter(s), symbol(s) or the like to identify the respective element(s), or identify other drawing(s) depicting the respective element(s) (partially or completely). Drawing(s) and/or instruction(s) depicting maintenance task(s) may include reference(s) such as number(s), letter(s), symbol(s) or the like to identify the respective maintenance task(s), or identify other maintenance task(s) depicting the respective maintenance task(s). Further, drawing(s) and/or instruction(s) depicting maintenance task(s) performed on or using element(s) may include reference(s) such as number(s), letter(s), symbol(s) or the like to identify the respective element(s), or identify drawing(s) depicting the respective element(s) (partially or completely). In the case of a reference identifying an element, the reference may be referred to as a callout. In one example, multiple drawings depicting the same element (partially or completely) may include the same callout to identify that element. In another example, a drawing of a complete view of an element may include a reference to another drawing of a detail view of the respective element.

As explained in greater detail below, then, the document collection system 102 of the panoptic visualization system 100 may be generally configured to receive documents and collect pages according to logical relationships between the pages, with the pages being collected as a document collection for panoptic visualization (a panoptic visualization document collection). As indicated above, in various examples, these documents may include system-related documents for a complex system. The 3D model collection system 104 may be generally configured to receive a digital 3D representation (model) of a complex system, and generate one or more two-dimensional (2D) derivatives therefrom. In one example, the 3D model collection system may then communicate these 2D derivatives to the document collection system as one or more system-related documents for the respective complex system.

The document layout system 106 may be generally configured to generate a layout of panoptically-arranged, logically-related pages of a panoptic visualization document collection, such as the collection from the document collection system 102. The document navigation system 108 may be generally configured to select and provide navigation option(s) for navigating a visual presentation of a layout of panoptically-arranged, logically-related pages of a panoptic visualization document collection, such as the layout generated by the document layout system. The spatial-based search system 110 may be generally configured to perform spatial-based searches for pages of a panoptic visualization document collection, such as the collection from the document collection system. In one example, these queries may be for pages depicting elements of a complex system at a particular location or within (partially or completely) a volume about or defined by one or more particular locations within a coordinate system of the complex system. The visual presentation of a layout may at times be generally referred to as simply the layout.

Example implementations of the present invention may therefore collect pages of document(s) according to logical relationships between the pages, which in one example in the context of a complex system such as an aircraft, may reflect spatial, design or functional relationships between its elements. The pages may be panoptically arranged in a manner that reflects the logical relationships, and in various examples, spatial, design or functional relationships. The arrangement may enable a user to see the pages in a single view, and in a manner that facilitates a better understanding of relationships that may be otherwise difficult to comprehend. In the context of a complex system for example, the arrangement may not only lessen the time required to review documents containing large amounts of information, but may also lessen the time required and ease the difficulty studying the information to understand the ways in which the complex system and its elements relate to each other.

Reference will now be made to FIGS. 2, 3, 4, 5 and 6, which illustrate more particular examples of a suitable document collection system, 3D model collection system, document layout system, document navigation system and spatial-based search system, respectively, according to example implementations of the present disclosure.

Figure 2:
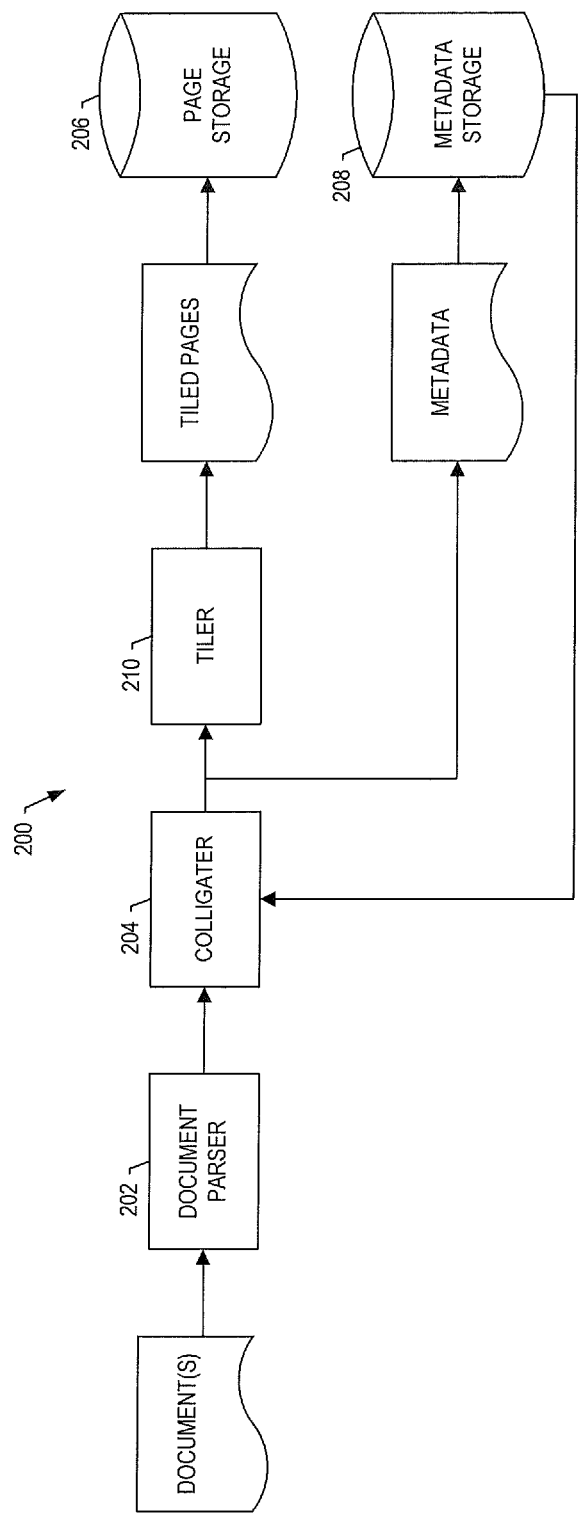
FIG. 2 is an illustration of a panoptic visualization document collection system in accordance with one example implementation.

FIG. 2 illustrates a document collection system 200 according to one example implementation. As shown, the document collection system may include a document parser 202 configured to receive and disassemble one or more electronic documents into a plurality of constituent pages (document components) each of which includes respective media content. The documents in one example may be disassembled according to the type of the documents (e.g., system-related documents, computer-aided design documents, presentation documents, graphics documents, video documents, legal documents, books, articles, web pages, engineering diagrams, technical drawings, wiring diagrams, etc.). The document parser may therefore also be configured to identify the type of the documents, such as based on the format of the documents, business rules or by user input. In one example, the documents may include one or more documents with pages not produced from a 3D model of a complex system, in contrast to other pages that may be produced from such a 3D model, as explained in greater detail below.

The document collection system 200 may also include a colligater 204 coupled to the document parser 202 and configured to colligate the pages. In this regard, the colligation of the pages may include, for each of one or more pages of the plurality, the colligater being configured to identify one or more links between the page and one or more other pages of the plurality. The link(s) of one example may be identified according to the documents, type of documents, and/or media content of the page and other page(s). In a more particular example, the link(s) may be identified according to the structure of the document, which as indicated above, may be defined according to a particular schema. And in one example, the link(s) may be defined in a number of different manners, such as according to one or more business rules, logic, schema or the like. These link(s) may establish one or more logical relationships between the page and other page(s).

In one example, a link may be identified between pages sharing a common document (constituents of the same document). In one example, a link may be identified between pages adjacent one another in a predetermined sequence, such as a time sequence, spatial sequence or an order sequence in a common document or collection of documents. In some instances, a link may be identified according to the subject(s) or object(s) of the pages. For example, a link may be identified between pages sharing a common subject or common object. In one example, a link may be identified between pages in which an object of one is a subject of the other (object-subject), or in which a subject of one is an object of the other (subject-object).

In one example, a link may be identified between pages related by a parent-child relationship, whether directly or indirectly by children sharing a common parent. In one example, a link may be identified between pages in instances in which one of the pages includes a reference or link to the other page in its media content. In this regard, a court decision may include a citation to another court decision (e.g., in the body of the court decision, or in a footnote, endnote or the like), or a page may include a hyperlink to another page. And in yet another example, a link may be identified between pages by user input specifying a link between pages.

In a more particular example in the context of a system-related document, a link may be identified between pages sharing a common system-related document, or pages adjacent one another in order sequence in a common system-related document. Link(s) may be identified between pages according to one or more spatial, design or functional relationships between element(s) of the complex system depicted by the pages, such as by 2D images of the pages. A link may be identified between pages depicting the same element (partially or completely). A link may be identified between a page depicting the complex system, and pages depicting the complex system's subsystems, parts or features. Similarly, a link may be identified between a page depicting a subsystem, and pages depicting the subsystem's parts or features. And a link may be identified between a page depicting a part, and pages depicting the part's features. In one example, at least one link may be identified between a page produced from a 3D model of the complex system (described below), and one of the other pages not produced from such a 3D model.

In other examples, link(s) may be identified between pages according to maintenance tasks performed on or using elements of the complex system, and the respective elements. A link may be identified between a page depicting an element of a complex system (partially or completely) and a page depicting a maintenance task (partially or completely) performed on or using the respective element. Likewise, a link may be identified between a page depicting a maintenance task (partially or completely) performed on or using an element and a page depicting the respective element (partially or completely). In various instances, these examples may reflect an object-subject or subject-object relationship, or may reflect a parent-child or other hierarchical relationship.

In yet other examples, link(s) may be identified between pages according to one or more maintenance tasks depicted by the pages. A link may be identified between pages depicting the same maintenance task. A link may be identified between pages depicting subtasks of the same maintenance task. Similarly, link may be identified between pages depicting actions of the same subtask. A link may be identified between a page depicting a maintenance task, and pages depicting the task's subtasks or actions. And a link may be identified between a page depicting a subtask, and pages depicting the subtask's actions.

In addition to identifying link(s) between pages, the colligator 204 may also be configured to extract, generate or otherwise provide, for each of one or more pages, metadata associated with the page. For a page, its associated metadata may provide any of a number of different pieces of information about the page. For example, the metadata may provide information identifying the link(s) between the page and other page(s) in metadata associated with the page. This information may include the names or other identifiers of the other page(s) linked to the page, and may also include an indication of the logical relationship(s) established by the link(s) therebetween (e.g., share common document, subject and/or object, adjacency, object-subject subject-object, parent-child, reference/link, user specified, etc.).

In addition to the link(s), the associated metadata for a page may include one or more other pieces of information about the page. For example, the metadata may provide information regarding the document for which the page is a constituent, such as the name or other identifier of the document, and/or an author, size, and/or time of creation or last revision of the document. Also for example, the metadata may provide information about the media content of the page. This information may include, for example, identification of the page's subject(s) and/or object(s), the portion of the page including one or more of the object(s), and/or a level of detail of one or more of the object(s) in the page.

In the context of a system-related document for a complex system, for example, the information provided by the metadata may include identification of and possibly other information regarding elements of the complex system (e.g., complex system, subsystems, parts, features). This information may include, for example, information (e.g., name, number, quantity, source, position, related elements) similar to that described above for a list of information regarding the complex system and/or one or more of its elements. For various system-related documents such as 2D derivatives of 3D models, the information may include for each of one or more elements, information that reflects the 3D geometry of the element within the coordinate system of the complex system, such as its a spatial location, volume extent, center of mass (or gravity) or the like. In various instances, a link between pages sharing a common subject, object or having an object-subject or subject-object relationship may be inferred from the metadata identifying the respective documents' subject(s) and/or object(s). In these instances, specification of a page's subject(s) and/or object(s) may suffice as information identifying the appropriate link(s) between pages.

The metadata may also provide information about one or more content restrictions applied or to be applied to the page, such as access restrictions, editing or modification restrictions, and/or encryption of the page. In one example in the context of a system-related document for a complex system such as aircraft, content restrictions may be applied on one or more bases such as organization (airline customer), type of or individual complex system (e.g., type of or individual aircraft), element of the complex system, maintenance task or the like. In this example, the information about the content restrictions may relate back to or otherwise incorporate other metadata, such as in the context of identification of users, types or individual complex systems, or information regarding its elements or maintenance tasks, which may be reflected elsewhere in the metadata.

In one example, the colligation of pages may further include the colligater 204 being configured to identify one or more layout models for at least some of the pages. In this example, the associated metadata extracted, generated or otherwise provided by the colligater for a page may further include information specifying an arrangement of the respective page in each of one or more of the layout models. For a respective layout model, this may include, for example, specifying a size, location and/or depth (z-order) of the page (or more particularly its visual representation). The layout model(s) may be identified and size, location and/or depth may be specified in any of a number of different manners, such as according to one or more business rules, logic or the like.

Examples of suitable layout models (sometimes referred to as styles of presentation) include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models. Each of a number of example layout models will be further described below.

In one example, the size of a page in a layout model may be specified as an absolute size or a relative size, either of which may be given in a number of different manners. In various instances, the size of the page may relate to a size in pixels and therefore give a pixel count or pixel resolution of the page. In one example, the absolute size of a page may be given in height and width dimensions (e.g., N×M pixels). In another example, the size of the page may be specified as a relative size based on the size of one or more other pages to which the page is logically related. For example, the relative size may be given in a number of different manners, such as in a percentage, fraction or multiple of other page(s); or the relative size may be given simply by an indication of smaller than, larger than or equal in size to other page(s). In pages related by a parent-child relationship, for example, the size of the child page may be specified as being half the size of its parent. In any event in which the size is relative, the size of the respective other page(s) may be given in their associated metadata, and may be given as an absolute size or relative size based on the size of even further other pages.

Similar to size, in one example, the location (sometimes referred to as position) of a page in a layout model may be specified as an absolute location or relative location, but in either event, may be given in a number of different manners. Likewise, the depth of a page in a layout model may be specified as an absolute depth or relative depth, either of which may be given in a number of different manners. For example, the absolute location of the page may be given in x, y coordinates of a coordinate system that spans the layout model, and/or the absolute depth may be given in a z coordinate of the coordinate system. In another example, the relative location of the page may be given in x, y coordinates relative to a point or other page(s) in the layout model. In yet another example, the relative location may be given simply by an indication of above, below, left or right of a point or other page(s) in the layout model. Similarly, in one example, the relative depth may be given simply by an indication of a page being in-front or behind other page(s) in the layout model. In any event in which the location and/or depth is relative, the location and/or depth of the respective other page(s) may be given in their associated metadata, and may be given as an absolute or relative location and/or depth.

The colligater 204 may be configured to communicate the pages and metadata as a panoptic visualization document collection, and communicate the collection to any of a number of different destinations. In one example, the colligater may be configured to communicate the pages and metadata to respective storage 206, 208 for later retrieval. The storage may be resident with the document collection system 200, or may be separate from and in communication with the document collection system. The pages and metadata may be formatted and stored in any of a number of different manners, and hence, their storage may be of any of a number of different types. Examples of suitable types of storage include file storage, database storage, cloud storage or the like.

In various examples, before pages are stored in respective storage 206, the pages may be compressed or otherwise processed for easier storage and retrieval. As shown, for example, the system may include a tiler 210 coupled to the colligater, and to which the colligater is configured to communicate the pages. The tiler may be configured to generate, for each of one or more pages, visual representations of the page at respective resolutions for zoom levels of the page. As described herein, the page (or rather its visual representation) at each zoom level may be generally referred to as a "sub-image," and may at times be considered a separate version or copy of the page. As suggested above, however, a sub-image of a page need not necessarily include a still image as the page may include other types of media content.

In addition to or in lieu of generating sub-images of a page, the tiler 210 may be configured to divide the sub-images across the zoom levels into progressively larger numbers of tiles each of which covers a spatial area of a sub-image at a respective zoom level. This may facilitate retrieval, panning and/or zooming of the page, as explained further below. The tiler may then be further configured to communicate the tiles of the sub-images of the pages, such as to the page storage. Before communicating the tiles, however, the tiler may be further configured to compress the tiles, if so desired.

In one more particular example, the tiler 210 may be configured to generate multiple resolutions of a page at respective zoom levels arranged hierarchically from a top zoom level through one or more intermediate zoom levels to a base zoom level. Each zoom level includes a sub-image of the entire page but at a different resolution; and the sub-images of the page across zoom levels may have the same native aspect ratio (ratio of the width of the image to its height). In one example, the top zoom level (level 0) may include a sub-image of the entire page at its lowest resolution, the one or more intermediate zoom levels may include a sub-image of the entire page at progressively higher resolutions (level 1 immediately below level 0, level 2 immediately below level 1, etc.), and the base zoom level (level L) may include a sub-image of the entire page at its highest (or full) resolution.

Each sub-image of a page may be generated in any of a number of different manners. In one example, one of the sub-images may be received by the tiler 210, such as the full-resolution sub-image. The tiler may then be configured to generate the other sub-images at lower resolutions, such as by downsampling the full-resolution sub-image.

As indicated, the tiler 210 may be configured to divide sub-images across zoom levels into progressively larger numbers of tiles each of which covers a spatial area of a sub-image at a respective zoom level. The tiles may have a fixed size (resolution) within and across the zoom levels, and accordingly, a sub-image composed of a larger number of tiles may generally have a higher resolution than a sub-image composed of a smaller number of tiles. Each zoom level may therefore be considered a higher zoom level relative to any zoom level above it (the sub-image at the zoom level being at a higher resolution than the sub-image at any zoom level above it). Similarly, each zoom level may be considered a lower zoom level relative to any zoom level below it (the sub-image at the zoom level being at a lower resolution than the sub-image at any zoom level below it).

In one example, the sub-image at each zoom level may be half the resolution of the zoom level immediately below it, and twice the resolution of the zoom level immediately above it (the resolutions increase or decrease by a factor of two). In this example, the number of tiles in a zoom level 1 may be given by $t_1 = t_0 \times 4^l$, in which $\mathbf{l} = 0, 1, 2, \ldots L$, and $t_0$ represents the number of tiles in the top zoom level (level 0). In a more particular example including four zoom levels 0, 1, 2 and 3 (L=3), and in which the top zoom-level sub-image is composed of 1 tile ($t_0=1$), the first intermediate zoom-level (level 1) sub-image may be composed of 4 tiles, the second intermediate zoom-level (level 2) sub-image may be composed of 16 tiles, and the base zoom-level (level 3) sub-image may be composed of 64 tiles.

In one example, a page covered by a number of tiles in one zoom level may be covered by an increased or decreased number of tiles in higher or lower zoom levels, respectively, thereby leading to an increase or decrease in resolution of the page. Similarly, an area of a page covered by one tile in one zoom level may be covered by multiple (e.g., four) tiles in an adjacent higher zoom level, thereby leading to an increase in resolution of the respective area of the page. And an area of a page covered by multiple tiles in one zoom level may be covered by one tile in an adjacent lower zoom level, thereby leading to a decrease in resolution of the respective area of the page.

In one example, a page (or area thereof) at a particular resolution may be displayed by the tile(s) covering the page at the zoom level commensurate with the particular resolution. A zoom-in of the page may be effectuated by replacing the displayed tile(s) with the increased number of tiles covering the page at a higher zoom level. And a zoom-out of the page may be effectuated by replacing the displayed tiles with the decreased number of tile(s) covering the page at a lower zoom level. And because the page may be divided into tiles, in instances in which a portion but not all of a page is viewable in a graphical user interface (GUI) in which the page is displayed, only those tiles covering the viewable portion of the page may be retrieved and displayed.

Figure 3:
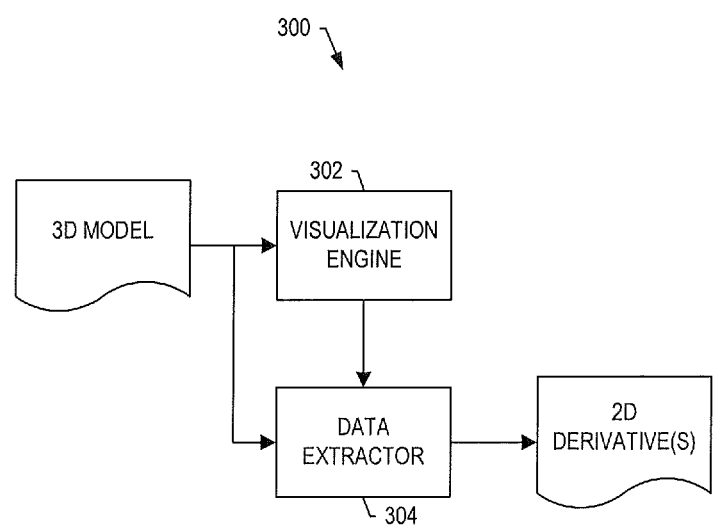
FIG. 3 is an illustration of a panoptic visualization three-dimensional (3D) model collection system in accordance with one example implementation.

Reference is now made to FIG. 3, which illustrates a 3D model collection system 300 according to one example implementation. As indicated above, the 3D model collection system 300 may be one example of the 3D model collection system 104 of the panoptic visualization system 100 of FIG. 1. The 3D model collection system may be generally configured to receive a digital 3D representation (model) of a complex system, and generate one or more two-dimensional (2D) derivatives from the 3D model, which may then be communicated as one or more system-related documents.

As shown in FIG. 3, the 3D model collection system 300 may include a visualization engine 302 configured to receive a digital 3D model of a complex system, such as a 3D CAD or other similar model (sometimes referred to as a solid model). In one example, the 3D model may represent the complex system as a collection of "primitives" such as edges, faces, points (e.g., vertices) and the like, which may be arranged into polygons or other arithmetically-derived structures to reflect the geometry of surfaces, volumes or elements of the respective complex system. The complex system may be defined by a "boundary" representation, or collection of polygons that demarcate the space occupied by the complex system, which may include sub-collections of polygons that demarcate spaces occupied by respective elements of the complex system. For some complex systems, the 3D model may use hundreds of thousands of polygons.

The 3D model may include information that may indicate a design type of the model, such as an art concept, preliminary design, released design or the like. The 3D model may include information (e.g., name, number, quantity, source, position, related elements) similar to that described above for a list of information regarding the complex system and/or one or more of its elements. The 3D model may even further include additional information that in some examples, with the 3D model, may compose a model-based definition (MBD) of the complex system. For example, the 3D model may include product manufacturing information (PMI) such as geometric dimensions and tolerances (GD&T), material specifications, component lists, process specifications, inspection requirements or the like. This information may convey engineering intent (EI), which may reflect the designer's intent for how the complex system should be fabricated, assembled, operated, maintained or the like. In various examples, this additional information may be provided directly in the 3D model, or in metadata associated with the 3D model.

The visualization engine 302 may be capable of interpreting the 3D model of the complex system and configured to produce one or more pages (electronic document components) including 2D images depicting elements of the complex system (e.g., complex system, subsystems, parts, features). In this regard, each page produced by the visualization engine may include one or more 2D images depicting one or more elements. These 2D images may include orthographic projection drawings, and each page may include one or more such drawings. In one example, each page may include a projection view, front view, top view, right-side view and/or left-side view of element(s) of the complex system.

In one example, the visualization engine 302 may be configured to produce pages of 2D images according to spatial, design or functional relationships between elements of the complex system, which in one example may be interpreted from information included with the 3D model. In this regard, the visualization engine may be configured to produce page(s) of 2D image(s) depicting elements of the complex system related to one another spatially, by-design or functionally within the complex system. For example, the visualization engine may be configured to produce a page of 2D image(s) depicting the complex system, and pages of 2D image(s) depicting the complex system's spatially, by-design or functionally-related subsystems, parts or features. In another example, the visualization engine may be configured to produce a page of 2D image(s) depicting a subsystem, and pages of 2D image(s) depicting the subsystem's spatially, by-design or functionally-related parts or features. And in yet another example, the visualization engine may be configured to produce a page of 2D image(s) depicting a part, and pages of 2D image(s) depicting the part's spatially, by-design or functionally-related features.

The visualization engine 302 may include or otherwise be coupled to a data extractor 304 configured to generate 2D derivatives of the 3D model. For each of one or more pages, for example, the data extractor may be configured to receive the page including a 2D image depicting an element of the complex system, and extract from the 3D model, information, information regarding element(s) depicted by the respective 2D image(s). The extracted information may include any of a variety of information included with the 3D model, such as that described above. In a more particular example, the extracted information may include the name/number of the complex system. The extracted information may include information identifying a spatial, design or functional relationship between the respective element depicted by the 2D image and one or more other elements of the complex system. For example, for each element depicted by a 2D image, the extracted information may include names/identifiers of any other elements spatially, by-design or functionally-related to the respective element, and may include an indication the relationship.

In one example, the extracted information may include for each element depicted by a 2D image, information that reflects the 3D geometry of the element within the coordinate system of the complex system, such as its a spatial location, volume extent, center of mass (or gravity) or the like. The spatial location or center of mass/gravity of an element may be specified in absolute or relative terms, and may be given in a number of different manners. In one example, the location of an element may be given in x, y, z coordinates of various ones of its points (e.g., vertices); and similarly, for example, its center of mass/gravity may be given in x, y, z coordinates. In these and other examples, each set of coordinates may be given in one or more different manners such as minimums, maximums, means or the like.

The data extractor 304 may also be configured to associate with the page(s) of 2D image(s), the extracted information regarding element(s) depicted by the respective 2D image(s). In one example, the data extractor may be configured to provide the extracted information in metadata associated with respective page(s). The data extractor may thereby be configured to generate 2D derivative(s) of the 3D model, with each 2D derivative including one or more page(s) of 2D image(s) and associated metadata. As indicated above, in various examples, the 2D derivative(s) may be communicated for inclusion in a panoptic visualization document collection, such as to the document collection system 102 of FIG. 1, or more particularly in one example, the document collection system 200 of FIG. 2. In these examples, the document collection system may process the 2D derivative(s) similar to other system-related documents, as explained above.

Figure 4:
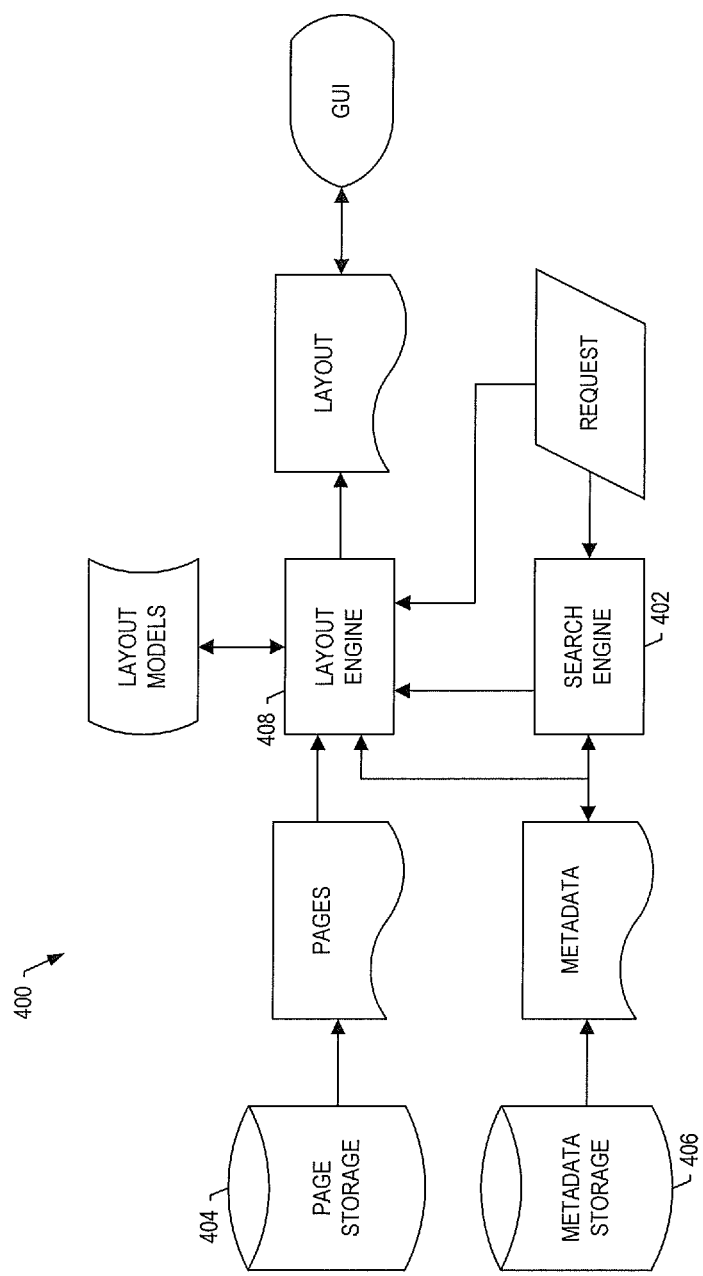
FIG. 4 is an illustration of a panoptic visualization document layout system in accordance with one example implementation.

Reference is now made to FIG. 4, which illustrates a document layout system 400 according to one example implementation. As indicated above, the document layout system 400 may be one example of the document layout system 106 of the panoptic visualization system 100 of FIG. 1. The document layout system may be generally configured to generate a layout of panoptically-arranged, logically-related pages of a panoptic visualization document collection. This collection may be, for example, the collection from the document collection system 102, or more particularly in one example, the document collection system 200 of FIG. 2.

As shown in FIG. 4, the document layout system 400 may include a search engine 402, request interface or the like configured to receive a request for media content and identify one or more pages including the requested media content. For example, the search engine may be configured to receive a request for a depiction of one or more elements of a complex system, such as a drawing that graphically depicts element(s), a textual list that textually depicts element(s) and/or graphical or textual maintenance task(s) performed on or using element(s). The identified page may be of a panoptic visualization document collection having a plurality of pages each of which includes respective media content and has associated metadata providing information about the respective page. The pages and metadata may be stored in respective storage 404, 406, which in one example may correspond to respective storage 206, 208 shown in FIG. 2.

The search engine 402 may be configured to identify page(s) in a number of different manners, such as based on the associated metadata of the pages of the collection. For example, the request may include a keyword matching or otherwise having relevance to a subject or object of page(s) of the collection. In response to the request, then, the search engine may be configured to search the metadata storage 406 for the associated metadata of one or more page(s) including media content matching or relevant to the request.

The document layout system 400 may also include a layout engine 408, layout generator or the like coupled to the search engine 402 and configured to select a layout model (style of presentation) from a plurality of layout models for panoptically-arranged pages of the plurality, including the identified page. The layout models may be maintained in a respective storage such as file storage, database storage, cloud storage or the like, and formatted and stored in any of a number of different manners according to the respective storage.

The layout models may include any of a number of different types of layouts for panoptically arranging pages. As indicated above and explained further below, examples of suitable layout models include brickwall, partial brickwall, hierarchy, shape, center out, top-down/triangulated, center-out triangulated, size dominance, overlap through detail, master-detail through depth, load shape, facet, mixed-media/static-and-dynamic or the like. Other examples may include combinations of one or more of the foregoing layout models.

The layout engine 408 may be configured to select the layout model in any of a number of different manners. In one example, the layout engine may be configured to select the layout model according to the associated metadata for the identified page. The search engine 402 may therefore be configured to communicate the associated metadata for the identified page to the layout engine, which in turn, may be configured to select a layout model according to the respective associated metadata.

As explained above, the associated metadata for a page may provide information about the type of document of which the page is a constituent, and/or information about media content of the page. In one example, then, the layout engine 408 may be configured to select the layout model according to the type of the document of which the identified page is a constituent (e.g., system-related document, computer-aided design document, presentation document, graphics document, video document, legal document, book, article, web page, engineering diagram(s), technical drawing(s), wiring diagram(s), etc.). In another example, the layout engine may be configured to select the layout model according to the structure of the document of which the identified page is a constituent, and/or schema according to which the respective document is structured. In yet another example, the layout engine may be configured to select the layout model according to the media content of the identified page, such as one or more of its subject(s) and/or object(s).

As also explained above, the associated metadata for a page may include information identifying link(s) between the page and other page(s) of the collection. The layout engine 408 may therefore also be configured to retrieve the identified page and other page(s) identified according to the associated metadata for the identified page. These pages may be retrieved from respective storage 404.

In one example, the associated metadata for a page may include information about one or more content restrictions applied or to be applied to the page, such as access restrictions, editing or modification restrictions, and/or encryption of the page. In the context of a system-related document for a complex system, for example, content restrictions may be applied on one or more bases such as organization, type of or individual complex system, element of the complex system, maintenance task or the like. In this example, the document layout system 400 may request or otherwise receive information regarding the user requesting the media content. This information may include identification of the user and/or any credentials of the user, which may be received from the user or stored in a user profile matched to the user's identification.

In the foregoing example, the layout engine 408 may then be configured to retrieve the identified page and other page(s) in accordance with the user information and content restrictions to be applied to the respective pages. In this regard, a user affiliated with an organization may be restricted to only page(s) in which their associated metadata allows access to the respective organization, or perhaps to a type or individual complex system that may be associated with that particular organization. In another example, a user associated with element(s) of the complex system with which the user is particularly knowledgeable may be restricted to only those page(s) depicting the respective element(s). In these instances, views of the layout and thus its pages may be configurable in a number of different manners according to content restrictions placed on the pages.

The layout engine 408 may be configured to generate a layout of the retrieved pages, panoptically-arranged according to the selected layout model, and the retrieved pages and their associated metadata. In addition to retrieving the pages, then, the layout engine of one example may also be configured to receive the associated metadata, such as from respective storage 406. The layout engine may then be configured to communicate the layout, such as to a GUI in which a layout may be displayed, or a printer for generating a printout of the layout.

In various examples, the layout may include at least some of the pages of 2D derivatives of a 3D model of a complex system, without any other pages not produced from such a 3D model. In other examples, the layout may include at least some of the pages of 2D derivatives of a 3D model of a complex system, and may also include one or more other pages not produced from such a 3D model. In these examples, the pages of 2D derivatives may include pages of 2D images depicting element(s) of the complex system, and may have associated metadata including information reflecting the 3D geometry of the respective element(s) within the coordinate system of the complex system. If any are included in the layout, the other page(s) may likewise depict element(s) of the complex system, but these other page(s) may have associated metadata absent information reflecting the 3D geometry of their respective element(s) within the coordinate system of the complex system.

As suggested, the layout may define a panoptic arrangement of the retrieved pages according to the selected layout model. In the arrangement of the layout, the pages may each have a particular size, location and/or depth (z-order). The size, location and/or depth of each page of the layout may be absolute or relative to other page(s) of the layout, and may be specified or otherwise determinable in a number of different manners. In one example, the sizes, locations and/or depths may be specified or otherwise determinable from a definition of the selected layout model of the layout models. Additionally or alternatively, for example, the associated metadata for each page of the layout may provide information specifying the size, location and/or depth (z-order) of it in the layout, as explained above. In these examples, the layout engine 408 may be configured to generate the layout according to the sizes, locations and/or depths specified by the selected layout model and/or associated metadata of the pages of the layout.

The aspect ratios of the pages may be their native aspect ratios. In various instances, however, a layout model may specify or otherwise define, for each of one or more pages, an aspect ratio that is different from the native aspect ratio of the respective page. In these instances, the layout engine 408 may be further configured to generate the layout according to the different, non-native aspect ratio(s) for the page(s).

In one further example, one or more of the pages of the layout may be in a state including visual representations (e.g., sub-images) at respective resolutions. For each of these pages, the layout engine 408 may be configured to retrieve the page for the visual representation at the resolution that matches or most closely matches the size specified by the selected layout model and/or associated metadata. This may include, for example, retrieving the sub-image of the page at or closest to the respective resolution.

The layout generated by the layout engine 408 may be dynamically generated according to a selected layout model such that a different layout of the pages may be realized by changing the selected layout model. A different layout may also be realized in a number of other manners, such as based on associated metadata of the pages of the layout or one or more time-based factors. In one example, the layout engine may therefore be further configured to receive a request for a different panoptic arrangement of the retrieved pages. In this example, the layout engine may be configured to select a different layout model from the plurality of layout models in response to the request. The layout engine may then be configured to generate a different layout of the retrieved pages. This may include the layout engine being configured to panoptically rearrange the retrieved pages according to the selected different layout model, and the retrieved pages and associated metadata for the retrieved pages.

In various examples described more fully below, the search engine 402, page and metadata respective storage 404, 406 and/or layout engine 408 may be included within or otherwise coupled to a spatial-based search system such as spatial-based search system 110. In these examples, the spatial-based search system may cause the layout engine to select a layout model and generate a layout of the pages, panoptically-arranged, such as in a manner the same as or similar to that explained above or otherwise herein.

As indicated above, the layout models may include any of a number of different types of layouts for panoptically arranging pages. In the layout models, logical relationship(s) established by link(s) between pages may be expressed by the arrangement of pages, in either or both of location or depth (z-order). In one example, logical relationships may be expressed by the proximity of pages to one another in their locations, and/or in their relative depths. Additionally, one or more of the layout models may define or imply a navigation path between documents related to one another, and/or a load shape for loading pages of a layout generated according to the respective layout models. FIGS. 7 and 8 schematically illustrate examples of suitable layout models in the form of a brickwall and hierarchy, respectively. For further details regarding other examples of suitable layout models, see at least the aforementioned '987 application.

FIG. 7 illustrates a brickwall layout model 700 according to one example implementation in which pages 702 may be arranged in one or more rows and one or more columns. As shown, the brickwall layout model may be characterized by a consistent end-to-end orientation with the pages being consistent in size and/or aspect ratio along one or more rows and/or columns. This type of layout model may be used for general search results. In one example, the layout model may provide a horizontal orientation related to chapter location, with a vertical orientation associated with a progressive increase in page length.

Although not separately shown, a partial brickwall layout model may be considered a superset of the brickwall layout model 700. The partial brickwall layout model may be characterized by clusters of pages that may similarly be consistent in size and/or aspect ratio at least within respective clusters. In this layout model, the clusters may be related by associated metadata of the respective pages, such as by their media content, author, time of creation, last revision or the like.

FIG. 8 illustrates a hierarchy layout model 800 according to one example implementation in which pages may be arranged in a hierarchy in location and/or size. A hierarchical relationship between pages (hierarchically-related pages) may be indicated by their associated metadata in a number of different manners. For example, a hierarchical relationship may be indicated by a parent-child relationship between pages. In another example, a hierarchical relationship may be indicated by an object-subject or subject-object relationship in which an object of one page higher in a hierarchy may be subject(s) of other page(s) lower in the hierarchy, and in which at least some of the respective other page(s) may be at the same level in the hierarchy. In this example, the subject of the one page may be a master view, and the subject(s) of the other page(s) may be detailed view(s) of object(s) of the master view. In yet another example, a hierarchical relationship may be indicated by a relationship in which one page higher in a hierarchy includes reference(s) or link(s) (e.g., citation, hyperlink, etc.) to other document(s) lower in the hierarchy, in which at least some of the respective other document(s) may be at the same level in the hierarchy.

In one example of the hierarchy layout model 800, pages higher in a hierarchy may be located above those lower in the hierarchy (top-down), and/or may be larger in size than those lower in the hierarchy. The pages in this layout model may not be consistent in size or aspect ratio. Those pages higher in the hierarchy may dominate those lower in the hierarchy, and in which pages lower in the hierarchy may be constrained in the x-direction by the width of pages higher in the hierarchy.

More particularly, for example, the highest page 802 in the hierarchy may be located at the top, and may be sized according to the page's full resolution with its native aspect ratio. The next-highest page(s) 804 in the hierarchy may be located immediately below the highest page at a size smaller than the highest page, and with an aspect ratio that constrains the next-highest page(s) collectively to the width of the highest page. This pattern may repeat for the third-highest page(s) 806 in the hierarchy below respective ones of the next-highest pages, for the fourth-highest page(s) 808 in the hierarchy, and so forth. This layout model may in one example provide a single page with related pages cited in the respective page below it.

Now turning back to FIG. 5, a document navigation system 500 is shown according to one example implementation. As indicated above, the document navigation system 500 may be one example of the document navigation system 108 of the panoptic visualization system 100 of FIG. 1. The document navigation system may be generally configured to select and provide navigation option(s) for navigating a layout of panoptically-arranged, logically-related pages of a panoptic visualization document collection. In one example, this may include the collection from the document collection system 102 (e.g., document collection system 200). Additionally or alternatively, for example, it may include the layout generated by the document layout system 106 (e.g., document layout system 400).

Figure 5:
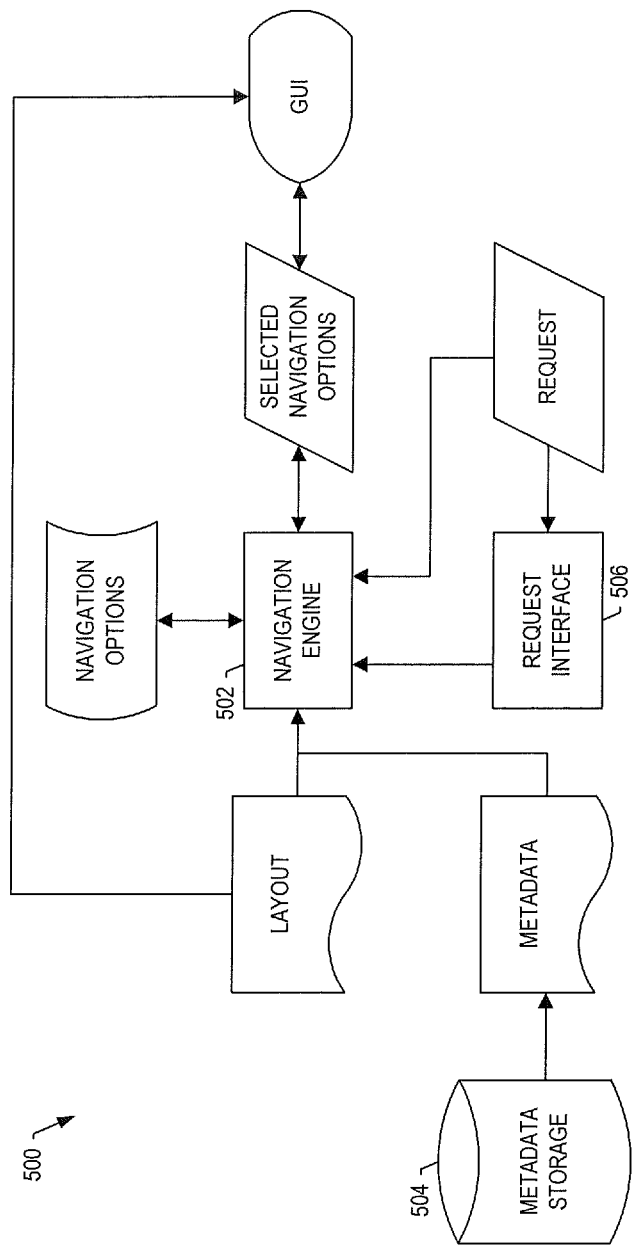
FIG. 5 is an illustration of a panoptic visualization document navigation system in accordance with one example implementation.

As shown in FIG. 5, the document navigation system 500 may include a navigation engine 502 configured to receive a layout of pages (document components) of a panoptic visualization document collection. The collection may have a plurality of pages each of which includes respective media content and have associated metadata providing information about the respective page. The layout may include a panoptic arrangement of visual representations of the pages of the layout according to the associated metadata of the respective pages.

The navigation engine 502 may also be configured to select one or more navigation options from a plurality of navigation options for navigating the layout, in which the navigation options may be selected according to the associated metadata for the pages of the layout. The navigation options may be maintained in a respective storage such as file storage, database storage, cloud storage or the like, and formatted and stored in any of a number of different manners according to the respective storage. Similarly, the metadata for the pages of the layout may be stored in a respective storage 504, which in one example may correspond to either or both of storage 208, 406. The navigation engine may also be configured to communicate the selected navigation options, such as to a GUI in which the selected navigation options may be presented along with the layout.

In one example, the navigation engine 502 may be configured to select navigation options according to the type(s) of document(s) of which the pages of the layout are constituents, which may be indicated in the associated metadata for the pages. In one example, the navigation engine may be configured to select navigation options according to the media content of the pages of the layout, such as their subject(s) and/or object(s), which may also be indicated in the associated metadata. Examples of suitable navigation options for a layout include command tools (e.g., pan, rotate, zoom, obscure/show, home, etc.), annotation tools (e.g., timeline/milestone, callout, etc.), linking tools (hyperlink, hotlink, hotspot, etc.), navigation path tools (e.g., tracking, recording, etc.), metadata tools (e.g., search, filter, insertion, etc.), page tools (e.g., search, filter, cue, activation, size, location, dominance, logical relationship(s), etc.), layout-model change, co-navigation, hyper-hypo navigation, printing or the like.

The associated metadata for the pages of the layout may directly or indirectly affect the selected navigation options. In one example, the associated metadata may be retrieved to directly affect the navigation options selected by the navigation engine 502. Additionally or alternatively, for example, the associated metadata for the pages may affect their layout, such as by affecting a selected layout model according to which the layout may be generated. More particularly, for example, the layout of pages may be generated according to a layout model selected according to the type of document(s) of the pages, and/or media content of the pages. The layout may then affect the navigation options selected by the navigation engine. In either event of the associated metadata directly or indirectly affecting the selected navigation options, the navigation engine may be said to select navigation options according to the associated metadata for pages of the layout.

The document navigation system 500 may also include a request interface 506 coupled to the navigation engine 502 and configured to receive a request according to one or more of the selected navigation options. The request interface may be configured to communicate the request to the navigation engine. The navigation engine may in turn be further configured to effect an adjustment of the visual representation of the layout in response to the request and according to the request, and communicate the adjustment such as to the aforementioned GUI. In one example, the navigation engine may be configured to effect the adjustment of the visual representation without adjustment of the layout itself. In another example, the navigation engine may be configured to effect the adjustment of the visual representation including adjustment of the layout.

As suggested above, the selected navigation options may be affected by a layout and/or its pages, or in one more particular example, the associated metadata for the pages of a layout. In various instances, then, layouts of different pages may result in the selection of one or more different navigation options. For example, consider that the navigation engine 502 may at different times receive a layout of first pages and a separate layout of second pages, with each layout including a panoptic arrangement of respective pages. In this example, the navigation engine may select first navigation options for the first layout, and second navigation options for the second layout. The first and second pages may include one or more common pages, but in one example, may also include one or more different pages. In this example, the first and second layouts may be different at least in that the first and second pages include one or more different pages. And in turn, the first and second navigation options selected by the navigation engine may include one or more different navigation options—although similar to the first and second pages, the first and second navigation options may include one or more common navigation options.

In various examples described more fully below, the metadata storage 504 and navigation engine 502 may be included within or otherwise coupled to a spatial-based search system such as spatial-based search system 110. In these examples, the spatial-based search system may cause the navigation engine to select navigation option(s), and/or receive a request to and effect an adjustment of the layout (and/or metadata), and communicate the adjustment, such as in a manner the same as or similar to that explained above or otherwise herein.

The navigation engine 502 may be configured to select any of a number of different navigation options for a layout of pages. Many layouts generated according to many different layout models, and including pages of many different types of documents, may include metadata tools such as search, filter, insertion or the like, which may operate with respect to the associated metadata for pages of the layout. The search and filter options may permit a user to search the associated layout for particular metadata, or filter the associated metadata to include or exclude particular metadata. The insertion option may permit the insertion of particular metadata to the visual presentation of the layout, such as in the form of a callout including the particular metadata referenced to page(s) for which the associated metadata includes the particular metadata.

The navigation options may include page tools such as search, filter, cue, activation, size, location, dominance, logical relationship(s) or the like. Similar to the metadata tools, the search and filter options may permit a user to search the pages of the layout for particular page(s) or particular media content. In this regard, the search and filter options may implicate the associated metadata for pages of the layout.

The cue option may permit the application of one or more visual effects to one or more pages to draw the user's attention to those page(s) in the layout. The visual effect may be any of a number of different effects. Examples of suitable visual effects include an opaque or translucent border of a noticeable color (e.g., yellow) around the page(s), an opaque or translucent visual object or shape smaller than and overlaying the page(s) or a translucent visual object or shape the same or greater in size than and overlaying the page(s), or the like. Examples of other suitable visual effects include an increase in a size of the page(s), an animation applied to the page(s), or the like.

The visual effect(s) may be triggered in any of a number of different manners, as may the page(s) to which the effect(s) are applied. For example, visual effect(s) may be triggered to indicate selection of one or more page(s). In this example, the visual effect(s) may be applied to the selected page(s). Additionally or alternatively in this example, visual effect(s) may be applied to page(s) having a particular logical relationship with the selected page(s) (e.g., share common document, subject and/or object, adjacency, object-subject subject-object, parent-child, reference/link, user specified, etc.). In another example, visual effect(s) may be applied to page(s) to indicate a navigation path followed by the user. For further details regarding these and other examples of suitable navigation options, see at least the aforementioned '964 application.

Figure 6:
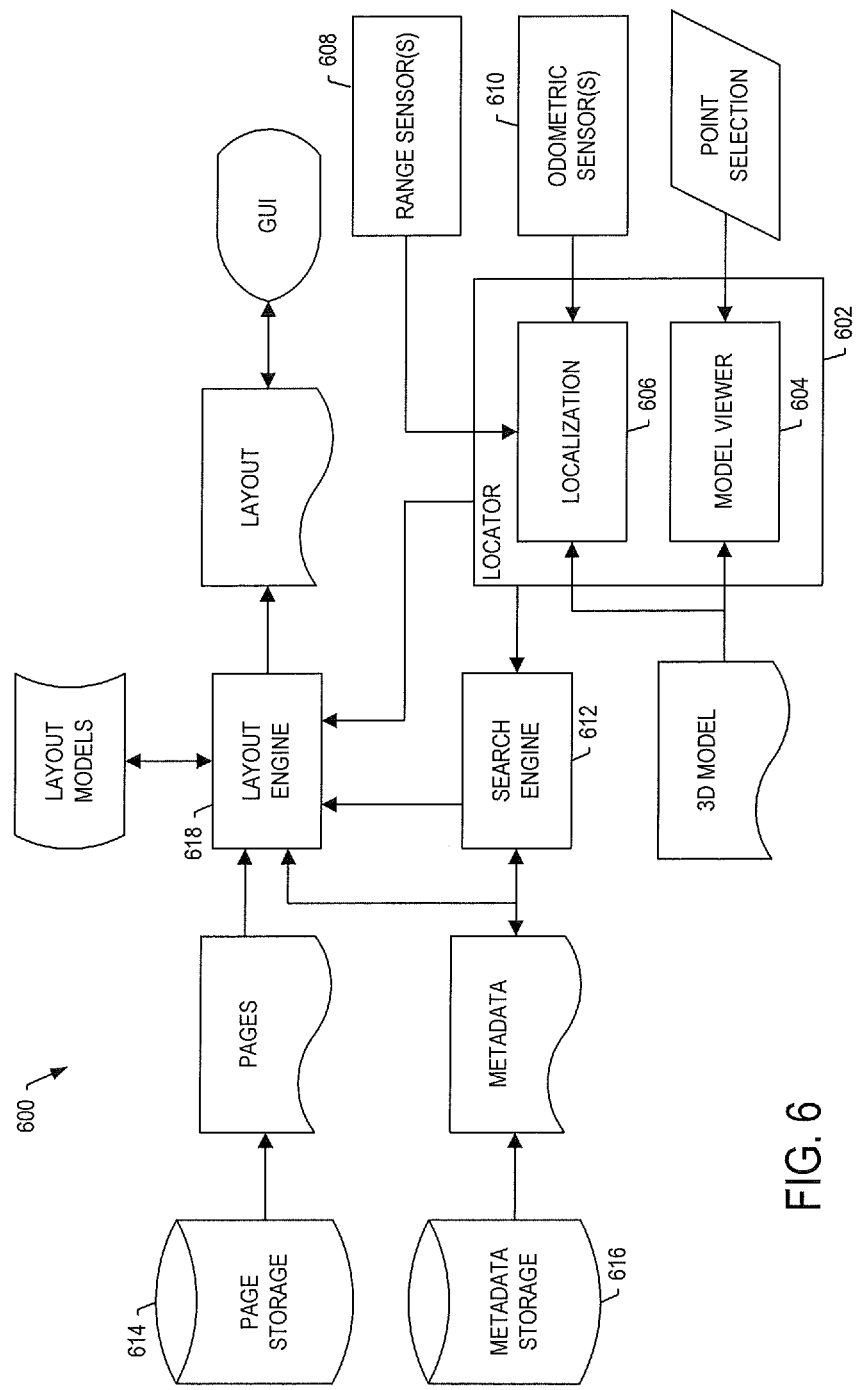
FIG. 6 is an illustration of a panoptic visualization spatial-based search system in accordance with one example implementation.

Turning to FIG. 6, a spatial-based search system 600 is shown according to one example implementation. The spatial-based search system may be one example of the spatial-based search system 110 of the panoptic visualization system 100 of FIG. 1. The spatial-based search system may be generally configured to perform spatial-based searches for pages of a panoptic visualization document collection, such as the collection from the document collection system 102 (e.g., document collection system 200). Additionally or alternatively, for example, it may include the collection of which the document layout system 106 (e.g., document layout system 400) generates a layout; and/or it may include the collection, a layout of which the document navigation system 108 (e.g., document navigation system 500) selects and provides navigation options.

As indicated above, the spatial-based search may be for pages depicting elements of a complex system at a particular location or within (partially or completely) a volume about or defined by one or more particular locations within the coordinate system of the complex system. The spatial-based search system 600 may therefore include a locator 602 configured to receive or calculate such a particular location. The locator may be configured to receive or calculate the particular location in any of a number of different manners. Examples of suitable techniques are disclosed in U.S. Pat. No. 7,859,655, entitled: Method Involving a Pointing Instrument and a Target Object, issued on Dec. 28, 2010, U.S. Pat. No. 7,873,494, entitled: Method and Apparatus for an Aircraft Location Position System, issued on Jan. 18, 2011, and U.S. Pat. No. 8,044,991, entitled: Local Positioning System and Method, issued on Oct. 25, 2011, the contents of all of which are incorporated herein by reference in their entireties.

In one example, the locator 602 may receive a particular location from a user, such as through an appropriate GUI including a textual entry field or other user-interface control for receiving the location. In one example, the locator may include a model viewer 604 capable of interpreting the 3D model of the complex system and configured to produce a visual presentation of the 3D model such as in a suitable GUI. The model viewer may be configured to produce the visual presentation in accordance with a number of techniques, such as those employed by CAD viewers, virtual reality modeling language (VRML) viewers, X3D viewers, Java 3D viewers, QuickTime virtual reality (VR) or QTVR viewers or the like. The model viewer may be configured to receive user-selection of a particular point on the visual presentation of the 3D model, and map or otherwise translate the particular point to a particular location on the complex system. In one example, this may be accomplished using the 3D model and its associated information.

In addition to or in lieu of the model viewer 604, in one example, the locator 602 may include a localization module 606 coupled to one or more range sensors 608 and/or odometric sensors 610. The range sensor(s) may be configured to provide range measurements between the sensor(s) at an origin in a second coordinate system (at times herein referred to as a "local" coordinate system), and a plurality of points at respective locations on a physical instance of the complex system. The odometric sensor(s) may be housed with or proximate the range sensor(s), and may be configured to provide odometry data. Examples of suitable range sensors include laser rangefinders, LiDAR (Light Detection and Ranging) sensors, sonar sensors, camera or other visual sensors, or the like. The odometric sensors may be of any of a number of different types of sensors, and may include not only odometric sensors but visual-odometric sensors, inertial measurement units (IMUs), accelerometers, gyroscopes or the like.

The points on the physical instance of the complex system for which the range sensor(s) 608 provide range measurements may include points at known locations within the coordinate system of the complex system (at times herein referred to as a "global" coordinate system), and a particular point at an unknown, particular location within the global coordinate system. In one example, the known locations may be taken from the 3D model of the respective complex system. The localization module 606 may therefore be configured to receive and process the range measurements and odometry data to calculate the unknown, particular location within the global coordinate system.

The localization module 606 may be configured to calculate the unknown, particular location in any of a number of different manners, such as in accordance with any of a number of multilateration techniques, multiangulation techniques or the like. An example of one suitable technique will now be described with reference to the diagrams of FIGS. 9 and 10. FIG. 9 illustrates a diagram of a local coordinate system, and FIG. 10 illustrates a diagram including both the local coordinate system and a global coordinate system.

In one example, the localization module 606 may be given points $P_1$, $P_2$ with known locations within the global coordinate system: $P_{G1}=(x_{G1}, y_{G1}, z_{G1})$, $P_{G2}=(x_{G2}, y_{G2}, z_{G2})$, and calculate the unknown, particular location of a third point $P_3$ in the global coordinate system: $P_{G3}=(x_{G3}, y_{G3}, z_{G3})$. As shown in FIGS. 9 and 10, this may include the range sensor(s) 608 providing range measurements for each of the three points, $D_1$, $D_2$ and $D_3$. The odometric sensor(s) 610 may provide azimuth angles between the third point and respective ones of the first and second points, $\alpha_1$ and $\alpha_2$; and in one example, the third point may be presumed to lie on the Y-axis of the local coordinate system such that $\alpha_3=0$. The odometric sensor(s) may also provide vertical angles between the horizontal x-y plane and each of the three points, $\beta_1$, $\beta_2$ and $\beta_3$.

The localization module 606 may receive respective measurements from the sensors 608, 610 for the three points: $P_1$ $(D_1, \alpha_1, \beta_1)$, $P_2$ $(D_2, \alpha_2, \beta_2)$ and $P_3$ $(D_3, 0, \beta_3)$, and calculate local coordinates $(x_L, y_L, z_L)$ of the points $P_1, P_2, P_3$ from the respective measurements. In one example with reference to FIG. 9, the localization module may calculate the local coordinates from the following equations:

$$x_L = D(\sin \alpha)(\cos \beta) \quad (1)$$

$$y_L = D(\cos \alpha)(\cos \beta) \quad (2)$$

$$z_L = D(\sin \beta)(-1) \quad (3)$$

The (−1) multiplier in equation (3) may be included to account for instances in which the odometric sensor(s) provide angles as negative values; in other examples in which the angles are provided as positive values, the multiplier may not be included. In either instance, the above calculations may yield local coordinates: $P_{L1}=(x_{L1}, y_{L1}, z_{L1})$, $P_{L2}=(x_{L2}, y_{L2}, z_{L2})$ and $P_{L3}=(x_{L3}, y_{L3}, z_{L3})$, although in one example $x_{L3}=0$.

The localization module 606 may then register the local coordinates of the third point in the global coordinate system of the complex system. In on example, the localization module may calculate the distance $D_{12}$ between points $P_1$ and $P_2$ from their known global coordinates. The localization module may then calculate the global coordinates $(x_0, y_0, z_0)$ of the local coordinate system origin from local coordinates $P_{L1}$, $P_{L2}$ and distances $D_1$, $D_2$ and $D_{12}$. In one example with reference to FIG. 10, this calculation may be performed in accordance with the following equations:

$$L_1 = \text{Arctan}\left(\frac{x_{G2} - x_{G1}}{y_{G2} - y_{G1}}\right) \quad (4)$$

$$L_2 = \text{Arccos}\left(\frac{D_{12}^2 + D_1^2 - D_2^2}{2D_{12}D_2}\right) \quad (5)$$

$$L_7 = 180° - L_2 \quad (6)$$

$$L_8 = L_7 + L_1 \quad (7)$$

$$x_{G1} = x_{L1}\cos L_8 - y_{L1}\sin L_8 + x_0; \quad (8)$$
$$x_0 = x_{G1} - (x_{L1}\cos L_8 - y_{L1}\sin L_8)$$

$$y_{G1} = x_{L1}\sin L_8 + y_{L1}\cos L_8 + y_0; \quad (9)$$
$$y_0 = y_{G1} - (x_{L1}\sin L_8 + y_{L1}\cos L_8)$$

$$z_{G1} = z_0 - z_{L1}; \quad (10)$$
$$z_0 = z_{G1} + z_{L1}$$

Then from local coordinates $P_{L3}$ and global coordinates $(x_0, y_0, z_0)$ of the local coordinate system origin, the localization module may calculate the unknown global coordinates $P_{G3}$ (particular location) of the third point $P_3$, such as in accordance with equations (8)-(10).

Regardless of the exact manner by which the locator 602 receives or calculates the particular location within the global coordinate system of the complex system, the locator may communicate the particular location to a search engine 612 as a spatial-based request for pages of a panoptic visualization document collection. Similar to the above, the panoptic visualization document collection may have pages each of which includes respective media content and has associated metadata. The pages and metadata may be stored in respective storage 614, 616, which in one example may correspond to respective storage 404, 406 shown in FIG. 4.

In response to the request, the search engine 612 may be configured to identify one or more pages depicting elements of the complex system at the particular location or within (partially or completely) a volume. In various examples, the volume may be a volume about the particular location, which may be preset, user-specified or the like. In other examples, the locator 602 may receive or calculate multiple particular locations within the global coordinate system of the complex system, which may be communicated to the search engine. In these examples, the multiple particular locations may define the volume for which the search engine may identify page(s) depicting elements of the complex system.

The search engine 612 may be configured to identify page(s) in a number of different manners, such as based on the associated metadata of the pages of the collection. As explained above, the metadata of various pages may include for element(s) that they depict, information that reflects the 3D geometry of the element within the coordinate system of the complex system, such as its a spatial location, volume extent, center of mass (or gravity) or the like. In one example, then, the search engine may identify page(s) depicting element(s) whose volume extent includes the particular location or is partially or completely within the volume about or defined by particular location(s). In other examples, the search engine may identify page(s) depicting element(s) having a point (e.g., vertex) or center of mass/gravity at the particular location or within the volume about or defined by particular location(s).

The spatial-based search system 600 may include a layout engine 618, or may be otherwise coupled to a layout engine such as the layout engine 408 of the document layout subsystem 400. The layout engine may be configured to select a layout model and generate a layout of pages, panoptically-arranged, such as in a manner the same as or similar to that explained above. In this regard, the layout engine may be configured to retrieve (from storage 614) the identified page(s) and perhaps other page(s) identified according to the associated metadata for the identified page, which as explained above, may include information identifying link(s) between pages. The retrieved pages, including the identified page(s) and any other page(s) may but need not include pages from system-related documents, at least some but perhaps not all of which may be 2D derivatives of a 3D model of the complex system. In various examples, the retrieved pages may include one or more 2D derivatives of a 3D model of the complex system, and whose associated metadata may include information that reflects the 3D geometry of element(s) of the complex system depicted by the respective 2D derivative(s). In one example, the retrieved pages may further include one or more pages that are not 2D derivatives, or whose metadata is otherwise without information reflecting the 3D geometry of element(s) depicted by the respective page(s).

In a manner similar to that explained above, the layout engine 618 (or layout engine 408 in communication with the spatial-based search system 600) may be configured to generate a layout of the retrieved pages, panoptically-arranged according to the selected layout model, and the retrieved pages and their associated metadata. In one example in which page(s) include sub-images, the layout engine may be configured to identify and retrieve sub-image(s) of page(s) that match or most closely match size(s) specified by the selected layout model and/or associated metadata. The layout engine may be configured to communicate the layout of pages such as to a GUI in which the layout may be displayed, or a printer for generating a printout including the layout.

In one example, the spatial-based search system 600 may further include a navigation engine, or may be otherwise coupled to a navigation engine such as the navigation engine 502 of the document navigation system 500. In this example, the respective navigation engine may be configured to select one or more navigation options from a plurality of navigation options for navigating the layout generated by the layout engine 618 (or layout engine 408 in communication with the spatial-based search system 600). The navigation options may be selected in a number of different manners, such as in a manner the same as or similar to that explained above. The navigation engine may then be configured to communicate the selected navigation options, such as to a GUI in which the selected navigation options may be presented along with the layout. The navigation engine may also be configured to receive a request according to one or more of the selected navigation options, effect adjustment of the layout in response and according to the request, and communicate the adjustment. In this example, the navigation engine may receive the request directly or via a suitable request interface (e.g., request interface 504).

Figure 11:
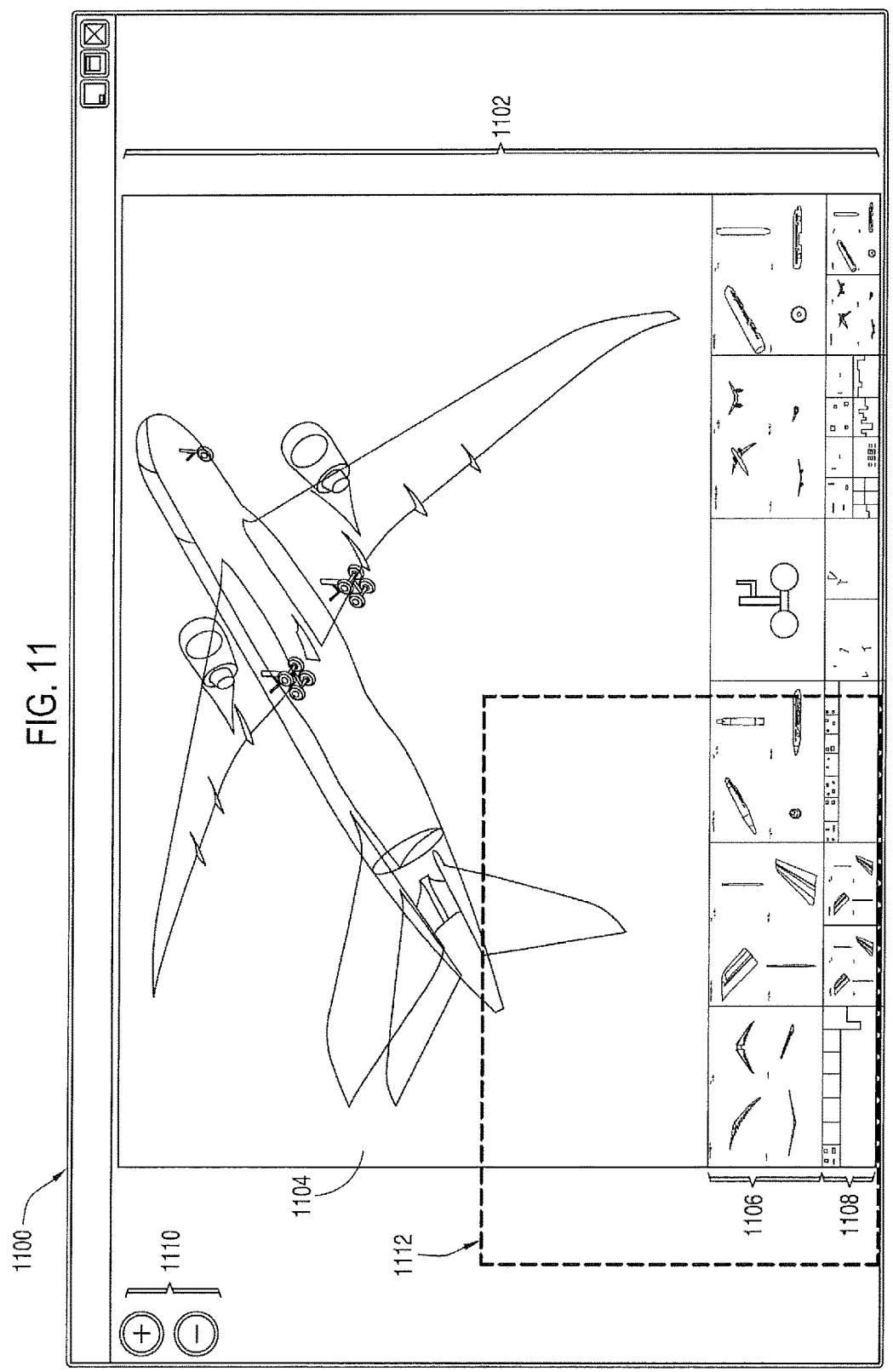
Figure 12:
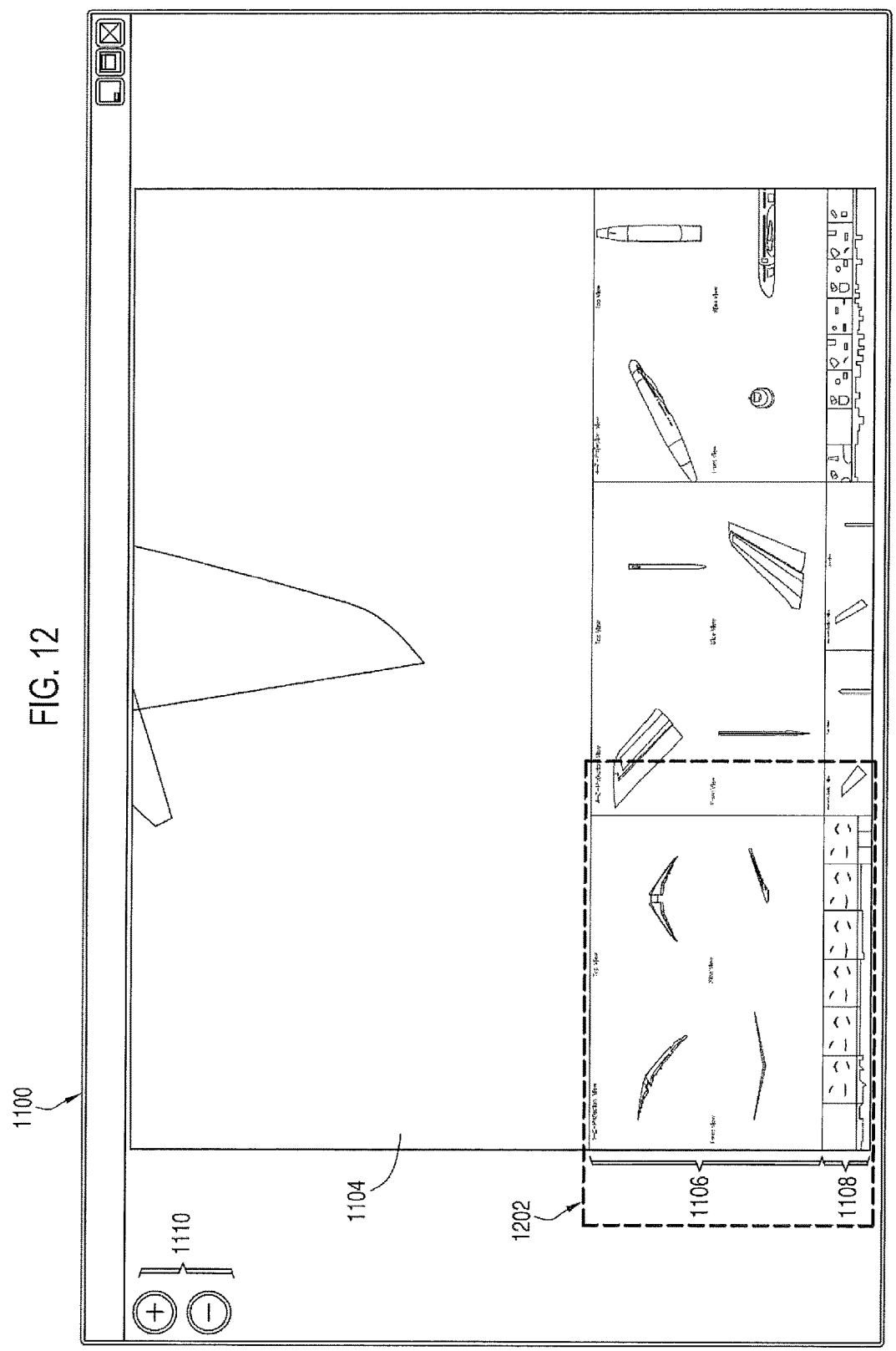
Figure 13:
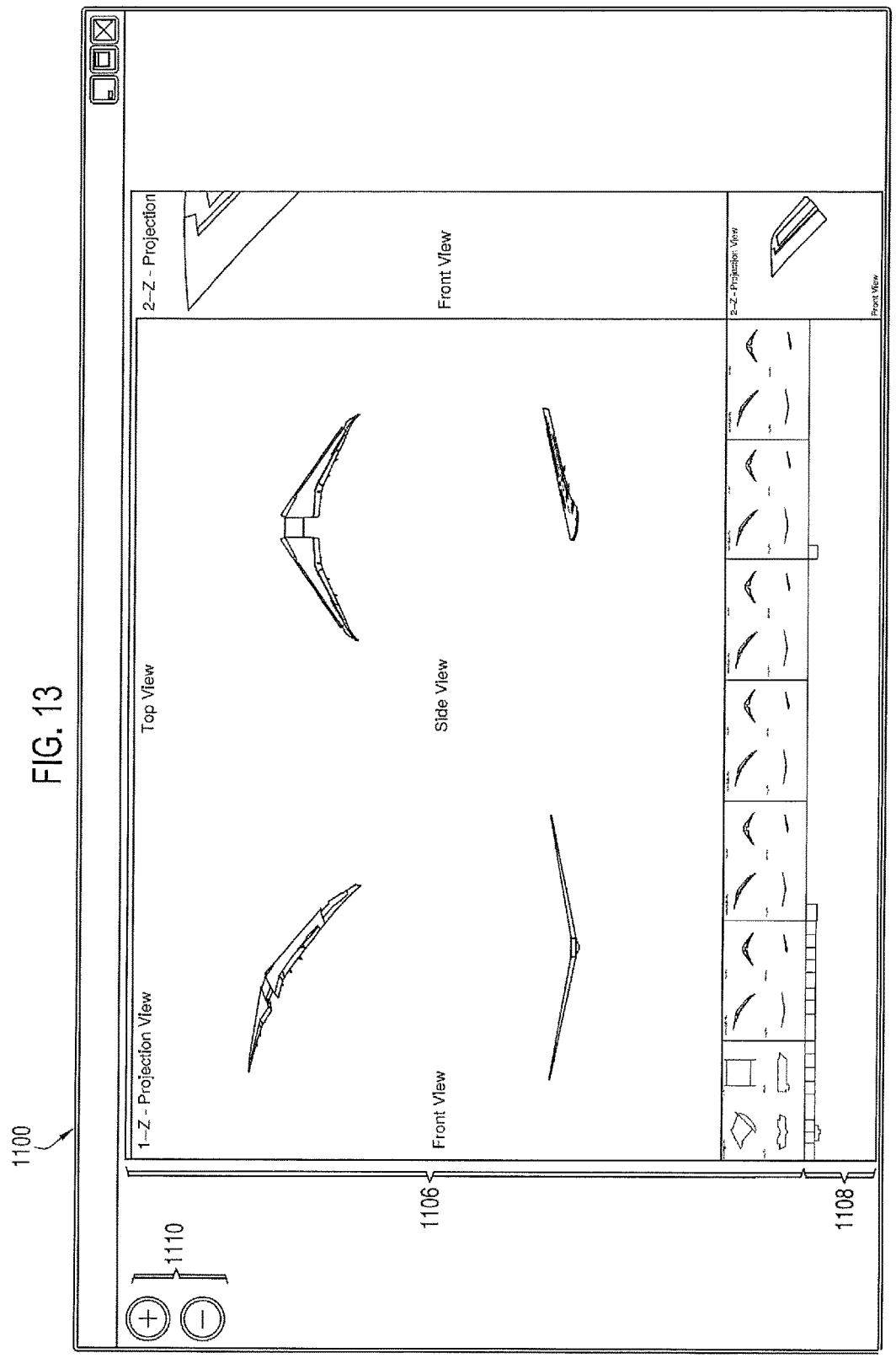
Figure 14:
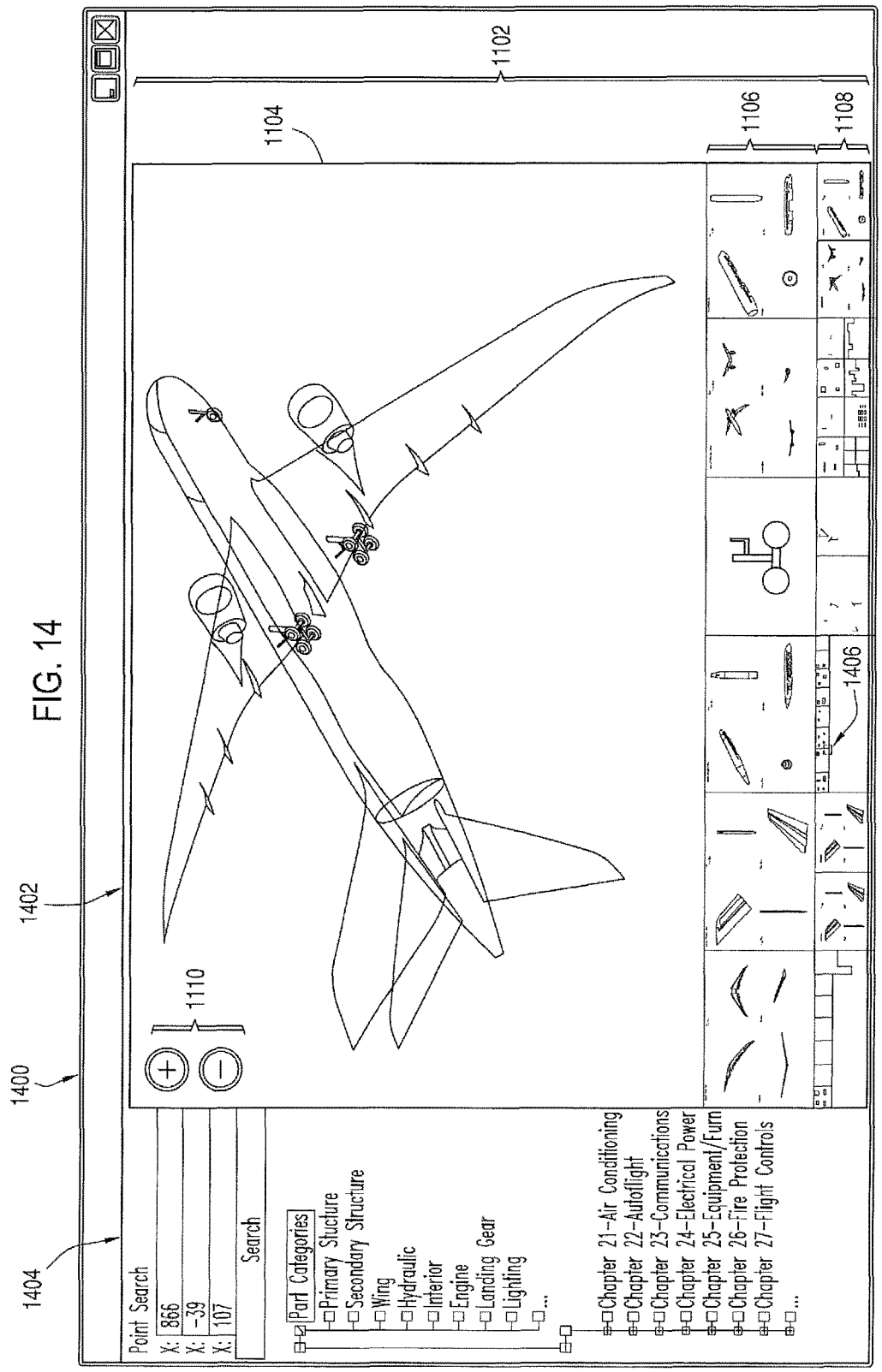

To even further illustrate example implementation of the present disclosure, reference will now be made to FIGS. 11-13, which depict example layouts of pages that may be displayed in a GUI that has a predetermined viewable area, and which may be navigated by a user, according to an example implementation of the present disclosure. FIGS. 11-13 illustrate an example of a layout according to the hierarchy layout model 800 displayed in a GUI that has a predetermined viewable area 1100. As shown, a layout according to the hierarchy layout model may include a plurality of pages 1102, each of which in one example may be a sub-image of the page at a respective resolution. Various ones of the pages may have different resolutions in the layout, with page 1104 having a higher resolution than pages 1106, which in turn have a higher resolution than pages 1108, some of which again in turn have a higher resolution than others of which lower in the hierarchy.

The pages may be located and/or sized in the layout according to logical relationship(s) between the pages. In the example shown, the pages 1102 are primarily from 2D derivatives of a 3D model of an aircraft but may also include one or more other pages not produced from the 3D model, and may have object-subject relationships. More particularly, for example, object(s) of a page on a level of the hierarchy may be subject(s) of pages below it in the hierarchy, the subject(s) in one example being additional detail regarding the object(s).

More particularly, for example, page 1104 may depict a projection view of an exterior of the entire aircraft. Pages 1106 may depict respective ones of a wing and wing box, tail, fuselage, landing gear, engine, and door assemblies. In the illustrated example, the pages 1106 depicting the wing and wing box, tail, fuselage, engine, and door assemblies may be from 2D derivatives of the 3D model, while the page 1106 depicting the landing gear may not be produced from the 3D model. Pages 1108 may depict additional detail about the element(s) depicted by respective ones of pages 1106. Each of pages 1106 (except that of the landing gear), 1108 may depict four views of a respective element, such as a projection view, front view, top view and side (left or right) view. In the viewable area 1100, however, pages 1108 (and perhaps even pages 1106) may be presented at a resolution that causes their media content to be only partially understood or not understood at all by a user. Of course, in other example implementations, pages 1108 may be presented at a sufficient resolution to interpret substantially all of their media content.

The GUI may present one or more selected navigation options for navigating the layout of pages 1102. In this illustrative example, pan and zoom navigation options may be presented in the form of controls 1110 to move and/or increase the size of the pages in the viewable area 1100 to focus on a portion 1112 of the layout. In other words, the user may activate the aforementioned controls to move and/or zoom the layout to fill a greater portion of the viewable area of the GUI with a portion of the layout. FIG. 12 illustrates one example of the result of navigating the layout in this manner.

As shown in FIG. 12, as the user activates controls 1110 to focus on the portion 1112 of the layout, the size of pages 1104-1108 may increase which, in one example, may include replacing sub-images of pages 1104-1106 with corresponding sub-images at higher resolutions. The resolution of the sub-images may allow the user to interpret substantially all of the presented media content. In this view, however, pages 1108 may not be presented with sufficient resolution to be interpreted by the user, because the size of the respective pages may not have been increased to a level implicating a next sub-image. That is, even after having increased the size of the image, the size may still most closely approximate the same sub-image so as to not cause its replacement with the next sub-image at a higher resolution. In one example in which only a portion of page 1104 is within the viewable area of the GUI, and in which the respective page is divided into tiles, only those tiles covering the viewable portion of the respective page may be retrieved and displayed.

In one example, the user may again activate controls 1110 to move and/or resize the view to focus on an even smaller portion 1202 of the layout, as shown for example in FIG. 13. Similar to before, as the user activates the controls 1110 to focus on the portion 1202 of the layout, the size of pages 1104-1108 may increase, which in one example, may now further include replacing a sub-image of page 1108 with a corresponding sub-image at a higher resolution.

FIGS. 14 and 15 again present the example layout shown in FIGS. 11-13 but in a further example in which the layout is presented along with fields or controls for performing a search for elements of the aircraft, such as by a spatial-based search. In this example, the GUI may divide its overall viewable area 1400 into a plurality of panes for presenting respective information. One of the panes may be or otherwise include the viewable area 1402 similar to viewable area 1100 for presenting a layout of pages, similar to that described above with respect to FIGS. 11-13. The GUI may also include a pane 1404 for browsing elements of the aircraft, such as through metadata associated with pages depicting such elements. From this pane, elements of the aircraft may be browsed or otherwise searched for desired elements such as by part categories, Air Transport Association (ATA) chapter numbers or the like. Additionally or alternatively, for example, the GUI may include in this pane a textual entry field for receiving a location for performing a spatial-based search for elements of the aircraft at the respective location, or within (partially or completely) a volume about the respective location.

Figure 15:
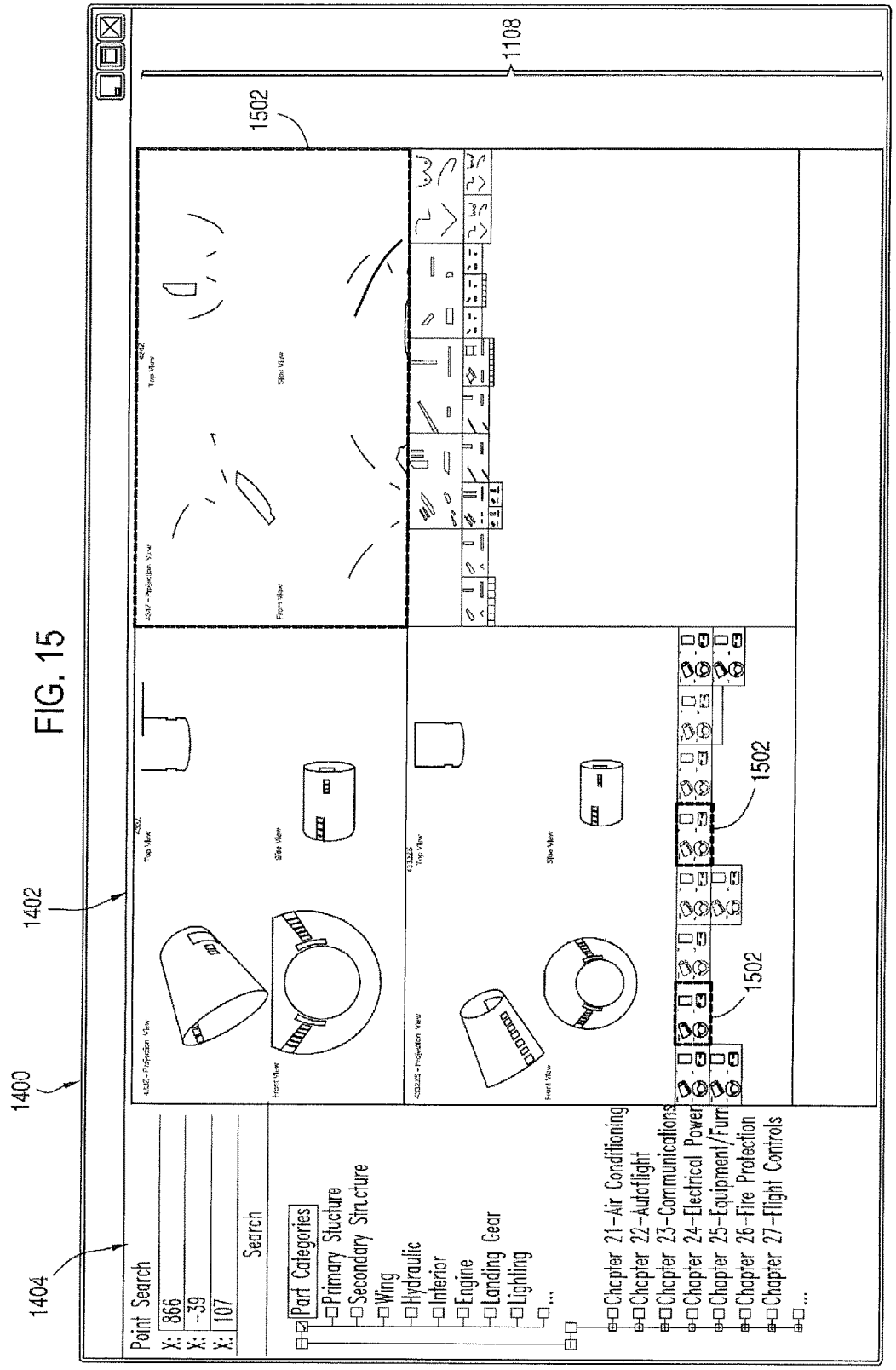

A user may enter a particular location (e.g., 866, −39, 107) in the textual entry field of pane 1404, which may initiate a search for pages of the layout depicting element(s) of the aircraft at the particular location or within a volume about the particular location. In one example, the document navigation system 108 may apply one or more visual effects to these page(s) to draw the user's attention to them, such as by use of the aforementioned cue option. In other examples, the navigation system could rearrange the layout to only show those page(s), or dim or turn the non-relevant page(s) semi-transparent. In the illustrated examples, the search results may include pages in a portion 1406 of the layout, and a user may activate controls 1110 to focus on the respective portion. FIG. 15 illustrates one example of the result of navigating the layout in this manner, and in which borders may be applied around respective pages 1502 of the search results.

According to example implementations of the present disclosure, the panoptic visualization system 100 and its subsystems including the document collection system 102, 3D model collection system 104, document layout system 106, document navigation system 108 and spatial-based search system 110 may be implemented by various means. Similarly, the examples of a document collection system 200, 3D model collection system 300, document layout system 400, document navigation system 500 and spatial-based search system 600, including each of their respective elements, may be implemented by various means according to example implementations. Means for implementing the systems, subsystems and their respective elements may include hardware, alone or under direction of one or more computer program code instructions, program instructions or executable computer-readable program code instructions from a computer-readable storage medium.

In one example, one or more apparatuses may be provided that are configured to function as or otherwise implement the systems, subsystems and respective elements shown and described herein. In examples involving more than one apparatus, the respective apparatuses may be connected to or otherwise in communication with one another in a number of different manners, such as directly or indirectly via a wireline or wireless network or the like.

Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, a processor (e.g., processor unit) connected to a memory (e.g., storage device).

The processor is generally any piece of hardware that is capable of processing information such as, for example, data, computer-readable program code, instructions or the like (generally "computer programs," e.g., software, firmware, etc.), and/or other suitable electronic information. More particularly, for example, the processor may be configured to execute computer programs, which may be stored onboard the processor or otherwise stored in the memory (of the same or another apparatus). The processor may be a number of processors, a multi-processor core or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more application-specific integrated circuits (ASICs), field-programmable gate arrays (FPGAs) or the like. Thus, although the processor may be capable of executing a computer program to perform one or more functions, the processor of various examples may be capable of performing one or more functions without the aid of a computer program.

The memory is generally any piece of hardware that is capable of storing information such as, for example, data, computer programs and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium which, as a non-transitory device capable of storing information, may be distinguishable from computer-readable transmission media such as electronic transitory signals capable of carrying information from one location to another. Computer-readable medium as described herein may generally refer to a computer-readable storage medium or computer-readable transmission medium.

In addition to the memory, the processor may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus(es), network(s) or the like. The communications interface may be configured to transmit and/or receive information by physical (wireline) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wireline or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by a processor, to implement functions of the systems, subsystems and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. It will also be understood that one or more functions, and combinations of functions, may be implemented by special purpose hardware-based computer systems and/or processors which perform the specified functions, or combinations of special purpose hardware and program code instructions.

As explained above, example implementations of the present disclosure permit the collection, layout and/or navigation of a large number of pages (or documents). Example implementations may allow a user to simultaneously and quickly view and visually search a large number of pages while using less bandwidth than retrieving all of the pages. In instances in which a user may generally have an idea of the appearance of page(s) of interest, or have an idea of a logical relationship between the respective page(s) and other pages, a layout of pages may be generated and/or navigated to allow the user to locate and use page(s) of interest. The user may view and navigate pages as though they were laid out in the physical world without the physical space requirement involved with large collections of pages.

Many modifications and other implementations of the disclosure set forth herein will come to mind to one skilled in the art to which this disclosure pertains having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Moreover, although the foregoing descriptions and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. An apparatus for implementation of a system for panoptic visualization of one or more elements of a complex system, the apparatus comprising a processor and a memory storing executable instructions that, in response to execution by the processor, cause the apparatus to implement at least:
a model viewer configured to receive user-selection of a particular point on a visual presentation of a digital three-dimensional (3D) model of a complex system, and translate the particular point to a particular location within a coordinate system of the complex system;

a search engine coupled to the model viewer and configured to identify a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and a layout engine coupled to the search engine and configured to generate a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof, wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof, wherein for each document component of the identified document component and the one or more other document components, the associated metadata further includes structured information specifying one or more of a size, location or depth of the document component in the layout, and the layout engine is configured to generate the layout according thereto.

2. An apparatus for implementation of a system for panoptic visualization of one or more elements of a complex system, the apparatus comprising a processor and a memory storing executable instructions that, in response to execution by the processor, cause the apparatus to implement at least:

a model viewer configured to receive user-selection of a particular point on a visual presentation of a digital three-dimensional (3D) model of a complex system, and translate the particular point to a particular location within a coordinate system of the complex system;

a search engine coupled to the model viewer and configured to identify a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and a layout engine coupled to the search engine and configured to generate a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof, wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof, wherein the respective media content of at least one of the document components of the layout depicts an element of the complex system and has associated metadata that includes structured information reflecting the 3D geometry of the respective depicted element within the coordinate system of the complex system, and wherein the respective media content of at least one other of the document components of the layout depicts an element of the complex system and has associated metadata absent information reflecting the 3D geometry of the respective depicted element within the coordinate system of the complex system.

3. A method comprising:

receiving user-selection of a particular point on a visual presentation of a digital three-dimensional (3D) model of a complex system, and translating the particular point to a particular location within a coordinate system of the complex system;

identifying a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and generating a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof, wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof, wherein for each document component of the identified document component and the one or more other document components, the associated metadata further includes structured information specifying one or more of a size, location or depth of the document component in the layout, and the layout is generated according thereto.

4. A method comprising:

receiving user-selection of a particular point on a visual presentation of a digital three-dimensional (3D) model of a complex system, and translating the particular point to a particular location within a coordinate system of the complex system;

identifying a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and generating a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof, wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof, wherein the respective media content of at least one of the document components of the layout depicts an element of the complex system and has associated metadata that includes structured information reflecting the 3D geometry of the respective depicted element within the coordinate system of the complex system, and wherein the respective media content of at least one other of the document components of the layout depicts an element of the complex system and has associated metadata absent information reflecting the 3D geometry of the respective depicted element within the coordinate system of the complex system.

5. A computer-readable storage medium that is non-transitory and has computer-readable program code portions stored therein that, in response to execution by a processor, cause an apparatus to at least:

receive user-selection of a particular point on a visual presentation of a digital three-dimensional (3D) model of a complex system, and translate the particular point to a particular location within a coordinate system of the complex system;

identify a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and generate a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof, wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof, wherein for each document component of the identified document component and the one or more other document components, the associated metadata further includes structured information specifying one or more of a size, location or depth of the document component in the layout, and the layout is generated according thereto.

6. A computer-readable storage medium that is non-transitory and has computer-readable program code portions stored therein that, in response to execution by a processor, cause an apparatus to at least:

receive user-selection of a particular point on a visual presentation of a digital three-dimensional (3D) model of a complex system, and translate the particular point to a particular location within a coordinate system of the complex system;

identify a document component of a panoptic visualization document collection having a plurality of document components, each document component of at least some of the document components including respective media content depicting an element of the complex system, and having associated metadata providing structured information reflecting a 3D geometry of the element within a coordinate system of the complex system, the respective media content of the identified document component depicting an element of the complex system at the particular location or within a volume about or at least in part defined by the particular location; and generate a layout of panoptically-arranged visual representations of document components including the identified document component and one or more other document components identified according to the associated metadata for the identified document component, which further includes structured information identifying a link between the identified document component and one or more other document components that establishes a logical relationship between the respective media content thereof,
  wherein the layout is a two-dimensional layout in which the logical relationship is expressed by a difference in size, location or depth of at least some of the visual representations relative to others of the visual representations, and wherein the visual representations of the document components in the layout are images of the document components including the respective media content thereof,
wherein the respective media content of at least one of the document components of the layout depicts an element of the complex system and has associated metadata that includes structured information reflecting the 3D geometry of the respective depicted element within the coordinate system of the complex system, and
  wherein the respective media content of at least one other of the document components of the layout depicts an element of the complex system and has associated metadata absent information reflecting the 3D geometry of the respective depicted element within the coordinate system of the complex system.

* * * * *